(12) United States Patent
Hirosaki et al.

(10) Patent No.: US 9,828,547 B2
(45) Date of Patent: Nov. 28, 2017

(54) PHOSPHOR, PRODUCTION METHOD FOR SAME, LIGHT-EMITTING DEVICE, IMAGE DISPLAY DEVICE, PIGMENT, AND ULTRAVIOLET ABSORBER

(71) Applicant: National Institute for Materials Science, Ibaraki (JP)

(72) Inventors: Naoto Hirosaki, Ibaraki (JP); Takashi Takeda, Ibaraki (JP); Shiro Funahashi, Ibaraki (JP); Eiichirou Narimatsu, Ibaraki (JP)

(73) Assignee: National Institute for Materials Science, Tsukuba-shi (JP)

( * ) Notice: Subject to any disclaimer, the term of this patent is extended or adjusted under 35 U.S.C. 154(b) by 168 days.

(21) Appl. No.: 14/890,469

(22) PCT Filed: May 13, 2014

(86) PCT No.: PCT/JP2014/062722
§ 371 (c)(1),
(2) Date: Nov. 11, 2015

(87) PCT Pub. No.: WO2014/185415
PCT Pub. Date: Nov. 20, 2014

(65) Prior Publication Data
US 2016/0096991 A1    Apr. 7, 2016

(30) Foreign Application Priority Data
May 14, 2013    (JP) .................................. 2013-102141

(51) Int. Cl.
*C09K 11/64*    (2006.01)
*C09K 11/08*    (2006.01)
(Continued)

(52) U.S. Cl.
CPC ............ *C09K 11/7792* (2013.01); *C08K 3/34* (2013.01); *C09K 11/0883* (2013.01);
(Continued)

(58) Field of Classification Search
CPC . C09K 11/7734; H01L 33/502; H01L 33/504; C08K 3/34
See application file for complete search history.

(56) References Cited

U.S. PATENT DOCUMENTS

2003/0094893 A1    5/2003    Ellens
2006/0192178 A1    8/2006    Hirosaki
(Continued)

FOREIGN PATENT DOCUMENTS

| JP | B 3668770 | 4/2005 |
| JP | B 3837551 | 8/2006 |
| JP | B 4524368 | 6/2010 |

OTHER PUBLICATIONS

Supplementary European Search Report and European Search Opinion; dated Feb. 16, 2017; (for equivalent application in Europe).

*Primary Examiner* — C Melissa Koslow
(74) *Attorney, Agent, or Firm* — Trojan Law Offices

(57) ABSTRACT

A phosphor having different light emission characteristics from the conventional phosphor, having high emission intensity and chemical and thermal stability, combined with LED of less than 450 nm. This phosphor includes an inorganic compound comprising: a crystal represented by $Ba_1Si_4Al_3N_9$, an inorganic crystal having the same crystal structure as $Ba_1Si_4Al_3N_9$ crystal, or a solid solution crystal thereof, comprising A element, D element, E element, and X element (A is one or more elements selected from Li, Mg, Ca, Sr, Ba, and La; D is one or more elements selected from Si, Ge, Sn, Ti, Zr, and Hf; E is one or more elements selected from B, Al, Ga, In, Sc, and Y; X is one or more elements
(Continued)

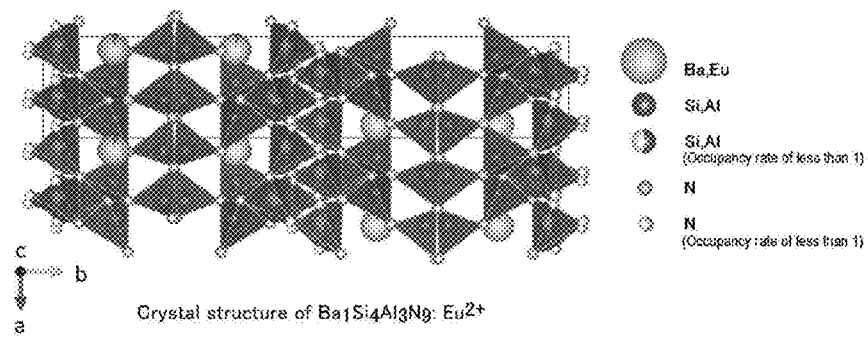

Crystal structure of $Ba_1Si_4Al_3N_9$: $Eu^{2+}$ selected from O, N, and F), into which M element is solid-solved (M is one or more elements selected from Mn, Ce, Pr, Nd, Sm, Eu, Tb, Dy, and Yb).

20 Claims, 5 Drawing Sheets

(51) Int. Cl.
     *C09K 11/59*        (2006.01)
     *C09C 1/62*         (2006.01)
     *C09K 3/00*         (2006.01)
     *H01L 33/50*       (2010.01)
     *C09K 11/77*       (2006.01)
     *C08K 3/34*        (2006.01)

(52) U.S. Cl.
     CPC ........ *C09K 11/7734* (2013.01); *H01L 33/502* (2013.01); *H01L 33/504* (2013.01); *H01L 2224/48091* (2013.01); *H01L 2224/48247* (2013.01); *H01L 2224/8592* (2013.01); *H01L 2924/181* (2013.01)

(56) References Cited

U.S. PATENT DOCUMENTS

| | | |
|---|---|---|
| 2007/0007494 A1 | 1/2007 | Hirosaki |
| 2007/0018567 A1 | 1/2007 | Hirosaki |
| 2007/0108896 A1 | 5/2007 | Hirosaki |
| 2009/0236969 A1 | 9/2009 | Hirosaki |
| 2012/0019127 A1 | 1/2012 | Hirosaki |
| 2012/0176568 A1 | 7/2012 | Hirosaki |

PHOSPHOR, PRODUCTION METHOD FOR SAME, LIGHT-EMITTING DEVICE, IMAGE DISPLAY DEVICE, PIGMENT, AND ULTRAVIOLET ABSORBER

TECHNICAL FIELD

The present invention relates to a phosphor, a manufacture thereof, and an application thereof, the phosphor comprising, as a main component, an inorganic compound in which an inorganic crystal represented by A(D, E)$_7$X$_9$ (where A is one or two or more elements selected from the group consisting of Li, Mg, Ca, Sr, Ba, and La; D is one or two or more elements selected from the group consisting of Si, Ge, Sn, Ti, Zr, and Hf; E is one or two or more elements selected from the group consisting of B, Al, Ga, In, Sc, and Y; and X is one or two or more elements selected from the group consisting of O, N, and F.); a crystal represented by BaSi$_4$Al$_3$N$_9$; an inorganic crystal having the identical crystal structure to that of the crystal represented by BaSi$_4$Al$_3$N$_9$; or a solid solution crystal of these crystals, into any of which an M element (where M is one or two or more elements selected from the group consisting of Mn, Ce, Pr, Nd, Sm, Eu, Tb, Dy, and Yb.) is solid-solved.

BACKGROUND ART

The phosphor is utilized in a fluorescent display tube (VFD: Vacuum-Fluorescent Display), a field emission display (FED: Field Emission Display or SED: Surface-Conduction Electron-Emitter Display), a plasma display panel (PDP: Plasma Display Panel), a cathode-ray tube (CRT: Cathode-Ray Tube), a liquid-crystal display backlight (Liquid-Crystal Display Backlight), a white light-emitting diode (LED: Light-Emitting Diode), and so on. In any of these applications, it is necessary to provide the phosphor with energy to excite the phosphor in order to make the phosphor emit fluorescence and the phosphor is excited by an excitation source with high energy such as a vacuum ultraviolet ray, an ultraviolet ray, an electron beam, and blue light so as to emit a visible light ray such as blue light, green light, yellow light, orange light, and red light. However, as a result of the phosphor being exposed to such excitation source, the luminance of the phosphor tends to decrease and a phosphor having little degradation in the brightness is desired. Therefore, a phosphor having an inorganic crystal containing nitrogen in a crystal structure thereof as a host crystal, instead a phosphor such as a silicate phosphor, a phosphate phosphor, a aluminate phosphor, and a sulfide phosphor, has been proposed, as exemplified by a sialon phosphor, an oxynitride phosphor, or a nitride phosphor, which is characterized by low brightness deterioration caused by high energy excitation.

An example of the sialon phosphors is manufactured by manufacturing processes as generally described below. First, silicon nitride (Si$_3$N$_4$), aluminum nitride (AlN), and europium oxide (Eu$_2$O$_3$) are mixed in predetermined molar ratios and the resultant mixture is fired by a hot press method in one atmospheric pressure (0.1 MPa) of nitrogen atmosphere at 1700° C. for one hour (for example, refer to Patent Reference 1). It was reported that α-sialon activated with an Eu ion (Eu$^{2+}$) manufactured by the above processes had become a phosphor emitting yellow light in a wavelength range of 550 to 600 nm if excited by blue light having a wavelength range of 450 to 500 nm. And it is known that an emission wavelength may vary as a ratio of Si to Al or a ratio of oxygen to nitrogen is changed while the α-sialon crystal structure is maintained (refer to Patent References 2 and 3).

As another example of the sialon phosphor, a green phosphor in which β-sialon is activated by Eu$^{2+}$ is known (refer to Patent Reference 4). It is known that, in the phosphor, an emission wavelength thereof may shift to a shorter wavelength by changing the oxygen content while the crystal structure remains the same (for example, refer to Patent Reference 5). Moreover, it is known that a blue phosphor is to be formed when β-sialon is activated by Ce$^{3+}$ (for example, refer to Patent Reference 6).

As an example of an oxynitride phosphor, a blue phosphor having a JEM phase (LaAl(Si$_{6-z}$Al$_z$)N$_{10-z}$O$_z$) as a host crystal, which is activated by Ce (refer to Patent Reference 7), is known. It is known that, in the phosphor, an emission wavelength may shift to a longer wavelength as an excitation wavelength shifts to a longer wavelength by substituting partially La with Ca while the crystal structure is maintained.

As another example of the oxynitride phosphor, a blue phosphor having a La—N crystal La$_3$Si$_8$N$_{11}$O$_4$ as a host crystal, which is activated by Ce, is known (refer to Patent Reference 8).

As an example of the nitride phosphor, a red phosphor having a crystal of CaAlSiN$_3$ as a host crystal, which is activated by Eu$^{2+}$, is known (refer to Patent Reference 9). Color rendering properties of a white LED are improved by utilizing this phosphor. A phosphor to which Ce was added as the activating element was reported to be an orange phosphor.

Thus, an emission color of the phosphor is determined by a combination of the crystal to act as the host (host crystal) and a metal ion (activating ion) being incorporated into the crystal. Further, emission characteristics such as an emission spectrum and an excitation spectrum, chemical stability, or thermal stability could be determined depending on the combination of the host crystal and the activating ion such that a phosphor may be regarded as another different phosphor when either host crystal thereof or activating ion thereof is different. Moreover, a material having a different crystal structure is different in the emission characteristics or in the stability because the host crystal is different even if the material has the same chemical composition such that the material is regarded as another different phosphor.

Further, kinds of constituent elements can be substituted in many phosphors while the same crystal structure of the host crystal is maintained, thereby changing the emission color. For example, although a phosphor having a YAG crystal to which Ce is added emits light of a green color, a phosphor having a YAG crystal in which Y is partially substituted with Gd and Al is partially substituted with Ga exhibits emission of a yellow color. Further, in a phosphor having CaAlSiN$_3$ to which Eu is added, it is known that a composition thereof varies by partially substituting Ca with Sr while the same crystal structure is maintained such that the emission wavelength shifts to a shorter wavelength. In this way, such a phosphor in which element substitution is performed while the same crystal structure is maintained is regarded as a material of the same group.

From the described above, it is important to find a host crystal having a new crystal structure in developing a new phosphor and it is possible to propose a new phosphor by activating such a host crystal with an emission-causing metal ion to make the host crystal exhibit luminescence characteristics.

PRIOR ART REFERENCES

Patent References

[Patent Reference 1] Japanese Patent No. 3668770, Specification.
[Patent Reference 2] Japanese Patent No. 3837551, Specification.
[Patent Reference 3] Japanese Patent No. 4524368, Specification.
[Patent Reference 4] Japanese Patent No. 3921545, Specification.
[Patent Reference 5] International Publication No. WO 2007/066733.
[Patent Reference 6] International Publication No. WO 2006/101096.
[Patent Reference 7] International Publication No. WO 2005/019376.
[Patent Reference 8] Japanese Patent Application Publication No. 2005-112922.
[Patent Reference 9] Japanese Patent No. 3837588, Specification.

SUMMARY OF THE INVENTION

Problem to be Solved by the Invention

The present invention aims to satisfy such demand and it is one of the objects to provide an inorganic phosphor that has emission characteristics (emission color and excitation characteristics, emission spectrum) different from those of a conventional phosphor, exhibits high emission intensity even when combined with an LED with a wavelength of less than 450 nm, and is chemically and thermally stable. It is another object of the present invention to provide a light-emitting device that utilizes such a phosphor and is excellent in durability, an image display device that utilizes such a phosphor and is excellent in durability, and a pigment and an ultraviolet absorber that utilize an inorganic compound constituting such a phosphor.

Means to Solve the Problem

Under such a situation, the present inventors investigated in detail a phosphor having, as a host, a new crystal containing nitrogen and a crystal in which a metal element or N in the crystal structure is substituted by another kind of element, so as to find out that a phosphor having, as the host, a crystal represented by $BaSi_4Al_3N_9$, an inorganic crystal having the same crystal structure as the $BaSi_4Al_3N_9$ crystal has, or a solid solution crystal of these emitted fluorescence of high brightness. And it was also found out that the phosphor having a specific composition emitted fluorescence of a blue color to a green color.

Further, it was found that a white color light-emitting diode (light-emitting device) with a high emission efficiency and a small temperature fluctuation, an illuminating device with the same diode, and an image display device rendering bright coloring could be obtained by utilizing such a phosphor. Further, it was also found that an inorganic compound constituting this phosphor could become a white pigment and an ultraviolet absorber to absorb an ultraviolet ray.

The present inventors conducted an intensive investigation in consideration of the above-mentioned background so as to successfully provide a phosphor rendering emission with a high intensity of a specific wavelength region by implementing configurations as described below. Further, a phosphor having excellent emission characteristics was successfully manufactured by employing a method described below. Further, a light-emitting unit, an illuminating device, an image display device, and pigment, ultraviolet absorber having excellent features were successfully provided by implementing the configuration recited in the following.

A phosphor according to the present invention may be a phosphor comprising: an inorganic compound comprising: a crystal represented by $BaSi_4Al_3N_9$, an inorganic crystal having the same (or identical) crystal structure as the crystal represented by $BaSi_4Al_3N_9$, or a solid solution crystal of these, which comprises at least an A element, a D element, an E element, and an X element (here, A is one or two or more kinds of elements selected from the group consisting of Li, Mg, Ca, Sr, Ba, and La; D is one or two or more kinds of elements selected from the group consisting of Si, Ge, Sn, Ti, Zr, and Hf; E is one or two or more kinds of elements selected from the group consisting of B, Al, Ga, In, Sc, and Y; X is one or two or more kinds of elements selected from the group consisting of O, N, and F), into which M element is solid-solved (here, M is one or two or more kinds of elements selected from the group consisting of Mn, Ce, Pr, Nd, Sm, Eu, Tb, Dy, and Yb), thereby solving the above problem.

The above crystal having the same crystal structure as the crystal represented by $BaSi_4Al_3N_9$ may be a crystal represented by $A(D, E)_7X_9$, in which the A element may include at least one element selected from the group consisting of Li, Mg, Ca, Sr, Ba, and La; the D element may include Si; the E element may include Al; and the X element may include N and, if necessary, the X element may further include O.

The above inorganic crystal having the same crystal structure as the crystal represented by $BaSi_4Al_3N_9$ may be $BaSi_4Al_3N_9$, $MgSi_4Al_3N_9$, $CaSi_4Al_3N_9$, $SrSi_4Al_3N_9$, $LaSi_4Al_3N_9$, $LiSi_4Al_3N_9$, $(Ba,Mg)Si_4Al_3N_9$, $(Ba,Ca)Si_4Al_3N_9$, $(Ba,Sr)Si_4Al_3N_9$, $(Ba,La)Si_4Al_3N_9$, or $(Ba,Li)Si_4Al_3N_9$.

The above inorganic crystal having the same crystal structure as the crystal represented by $BaSi_4Al_3N_9$ may be represented by a composition formula of: $BaSi_{4-p}Al_{3+p}O_pN_{9-p}$, $MgSi_{4-p}Al_{3+p}O_pN_{9-p}$, $SrSi_{4-p}Al_{3+p}O_pN_{9-p}$, $LaSi_{4-p}Al_{3+p}O_pN_{9-p}$, $LiSi_{4-p}Al_{3+p}O_pN_{9-p}$, $(Ba, Mg)Si_{4-p}Al_{3+p}O_pN_{9-p}$, $(Ba,Ca)Si_{4-p}Al_{3+p}O_pN_{9-p}$, $(Ba,Sr)Si_{4-p}Al_{3+p}O_pN_{9-p}$, $(Ba,La)Si_{4-p}Al_{3+p}O_pN_{9-p}$, or $(Ba,Li)Si_{4-p}Al_{3+p}O_pN_{9-p}$, where $0 \leq p < 4$.

The above M element may be Eu.

The above inorganic crystal having the same crystal structure as the crystal represented by $BaSi_4Al_3N_9$ may be a crystal of the monoclinic crystal system.

The above inorganic crystal having the same crystal structure as the crystal represented by $BaSi_4Al_3N_9$ may be a crystal that belongs to the monoclinic crystal system and has the symmetry of space group P2(1)/c and in which lattice constants a, b, and c thereof may have values in the following ranges:
a=0.58465±0.05 nm,
b=2.67255±0.05 nm, and
c=0.58386±0.05 nm.

The above inorganic crystal is represented by a composition formula $M_dA_eD_fE_gX_h$ (here, in the formula, d+e+f+g+h=1, M is one or two or more kinds of elements selected from the group consisting of Mn, Ce, Pr, Nd, Sm, Eu, Tb, Dy, and Yb; A is one or two or more kinds of elements selected from the group consisting of Li, Mg, Ca, Sr, Ba, and La; D is one or two or more kinds of elements selected from the group consisting of Si, Ge, Sn, Ti, Zr, and Hf; E is one or two or more kinds of elements selected from the group consisting of B, Al, Ga, In, Sc, and Y; and X is one or two or more kinds of elements selected from the group consisting of O, N, and F) and parameters d, e, f, g, and h satisfy all the following conditions:
0.00001≤d≤0.05,
0.01≤e≤0.07,
0.10≤f≤0.30,
0.10≤g≤0.30, and
0.45≤h≤0.65.

The parameters d, e, f, g, and h may have values in respective ranges satisfying all the following conditions:
d+e=(1/17)±0.05,
f+g=(7/17)±0.05, and
h=(9/17)±0.05.

The parameters f and g may satisfy the following condition:
0<f/(f+g)≤1.

The X element may include O and N and the inorganic compound may be represented by the composition formula of $M_d A_e D_f E_g O_{h1} N_{h2}$ (here, in the formula, d+e+f+g+h1+h2=1 and h1+h2=h) and satisfy the condition:
0<h1/(h1+h2)≤6/9.

The M element may include at least Eu.

The A element may include at least Ba, the D element may include at least Si, the E element may include at least Al, and the X element may include at least N.

The composition formula of the inorganic compound may be represented by

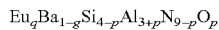
$Eu_q Ba_{1-g} Si_{4-p} Al_{3+p} N_{9-p} O_p$ using parameters p and q,
wherein:
0≤p<4 and
0.0001≤q<1.

The inorganic compound may comprise a single crystal particle or an agglomerate of single crystal particles having a mean particle diameter of at least 0.1 μm and not exceeding 20 μm.

The sum of Fe, Co, and Ni impurity elements included in the inorganic compound may be not exceeding 500 ppm.

The phosphor may further include an amorphous phase or another crystal phase in addition to the inorganic compound and the content amount of the inorganic compound may be at least 20 mass %.

The other crystal phase or the amorphous phase may comprise inorganic substance having electric conductivity.

The inorganic substance having the electrical conductivity may comprise: oxide, oxynitride, nitride, or a mixture of these, each of which includes one or two or more kinds of elements selected from the group consisting of Zn, Al, Ga, In, and Sn.

The other crystal phase or the amorphous phase may comprise another inorganic phosphor other than the above-mentioned phosphor.

The phosphor may emit fluorescence having a peak in the wavelength range that is at least 450 nm and not exceeding 530 nm upon irradiation by an excitation source.

The excitation source may comprise a vacuum ultraviolet ray, an ultraviolet ray, or visible light having a wavelength that is at least 100 nm and not exceeding 410 nm, or an electron beam or an X-ray.

The phosphor may emit fluorescence of a blue color to a green color having a wavelength of at least 450 nm and not exceeding 530 nm upon irradiation of the light having the wavelength of at least 280 nm and not exceeding 405 nm.

The color of light emitted by the phosphor upon irradiation by an excitation source may satisfy, in terms of values of (x, y) of the CIE 1931 chromaticity coordinates, the following conditions:
0≤x≤0.4 and
0≤y≤0.9.

The method of manufacturing a phosphor according to the present invention comprises the step of firing a raw material mixture, which is a mixture of metal compounds and could constitute the inorganic compound by firing, in an inert atmosphere including nitrogen at a temperature range of at least 1200° C. and not exceeding 2200° C., thereby solving the above problem.

The mixture of metal compounds may comprise: a compound including M, a compound including A, a compound including D, a compound including E, and a compound including X (wherein M is one or two or more kinds of elements selected from the group consisting of Mn, Ce, Pr, Nd, Sm, Eu, Tb, Dy, and Yb; A is one or two or more kinds of elements selected from the group consisting of Li, Mg, Ca, Sr, Ba, and La; D is one or two or more kinds of elements selected from the group consisting of Si, Ge, Sn, Ti, Zr, and Hf; E is one or two or more kinds of elements selected from the group consisting of B, Al, Ga, In, Sc, and Y; and X is one or two or more kinds of elements selected from the group consisting of O, N, and F).

The compound including M may be a single kind of substance or a mixture of at least two kinds of substances selected from the group consisting of metal, silicide, oxide, carbonate, nitride, oxynitride, chloride, fluoride and oxyfluoride, each of which includes M; the compound including A may be a single kind of substance or a mixture of at least two kinds of substances selected from the group consisting of metal, silicide, oxide, carbonate, nitride, oxynitride, chloride, fluoride, and oxyfluoride, each of which includes A; the compound including D may be a single kind of substance or a mixture of at least two kinds of substances selected from the group consisting of metal, silicide, oxide, carbonate, nitride, oxynitride, chloride, fluoride, and oxyfluoride, each of which includes D; and the compound including E may be a single kind of substance or a mixture of at least two kinds of substances selected from the group consisting of metal, silicide, oxide, carbonate, nitride, oxynitride, chloride, fluoride, and oxyfluoride, each of which includes E.

The mixture of metal compounds may include, at least, nitride or oxide of europium; nitride, oxide, or carbonate of barium; silicon oxide or silicon nitride; and aluminum oxide or aluminum nitride.

The range of the inert atmosphere including nitrogen may be at least 0.1 MPa and not exceeding 100 MPa, and the inert atmosphere including the nitrogen may comprise a nitrogen gas atmosphere.

Graphite may be satisfactorily used for a heating element, a heat-insulating element, or a sample container of the firing furnace.

The mixture of metal compounds may be in a state of powder or agglomerate and may be fired after the metal compounds are filled in a container with a filling rate kept at a bulk density of not exceeding 40%.

The mixture of metal compounds may be kept in a container made of boron nitride.

The mixture of metal compounds may be in a state of powder or agglomerate and a mean particle diameter of powder particles or agglomerates of the metal compounds may be not-exceeding 500 μm.

A spray dryer, sieving, or pneumatic classification may be employed.

The above firing may be performed with the pressureless sintering method or the gas pressure sintering method.

A mean particle diameter of phosphor powder synthesized by firing may be adjusted to be at least 50 nm and not exceeding 20 μm by applying one or more techniques selected from pulverization, classification, and acid treatment.

A phosphor powder after firing or a phosphor powder after pulverizing treatment or a phosphor powder after adjusting the particle size may be heat-treated at least 1000° C. and not exceeding the firing temperature.

An inorganic compound to form a liquid phase at a temperature of a firing temperature or lower may be added to the mixture of metal compounds and then the thus-obtained mixture may be fired.

The inorganic compound to form the liquid phase at the temperature of the firing temperature or lower may include a single kind of or a mixture of two or more kinds of fluoride, chloride, iodide, bromide, or phosphate of one or two or more kinds of elements selected from Li, Na, K, Mg, Ca, Sr, and Ba.

Further, the content amount of the inorganic compound forming the liquid phase at the temperature of the firing temperature or lower may be decreased by washing the phosphor with a solvent after the firing.

The light-emitting device according to the present invention comprises at least a light-emitting body or an emission source, and the phosphor wherein the phosphor includes at least the above-described phosphor, thereby solving the above problem.

The light-emitting body or the emission source may comprise an organic EL light-emitting body (OLED), a semiconductor laser, a laser diode (LD), or a light-emitting diode (LED), which emits light of wavelength from 280 to 450 nm.

The light-emitting device may comprise a white color light-emitting diode, or an illuminating device including the plurality of white color light-emitting diodes, or a backlight for a liquid-crystal display panel.

The light-emitting body or the emission source may emit an ultraviolet ray or visible light having a peak wavelength of at least 280 nm and not exceeding 450 nm, and light of a white color or another color other than the white color may be emitted by mixing light of a blue color to a green color emitted by the above phosphor and light having the wavelength of 450 nm or higher emitted by another phosphor.

The above phosphor may further comprise a blue phosphor to emit light having the peak wavelength of at least 420 nm and not exceeding 500 nm by the above light-emitting body or the emission source.

The above blue phosphor may be selected from AlN: (Eu, Si), $BaMgAl_{10}O_{17}$:Eu, $SrSi_9Al_{19}O_{31}$:Eu, $LaSi_9Al_{19}N_{32}$:Eu, α-sialon:Ce, and JEM:Ce.

The above phosphor may further comprise a green phosphor to emit light having the peak wavelength of at least 500 nm and not exceeding 550 nm by the above light-emitting body or the emission source.

The above green phosphor may be selected from β-sialon: Eu, $(Ba,Sr,Ca,Mg)_2SiO_4$:Eu, and $(Ca,Sr,Ba)Si_2O_2N_2$:Eu.

The above phosphor may further comprise a yellow phosphor to emit light having the peak wavelength of at least 550 nm and not exceeding 600 nm by the above light-emitting body or the emission source.

The above yellow phosphor may be selected from YAG: Ce, α-sialon:Eu, $CaAlSiN_3$:Ce, and $La_3Si_6N_{11}$: Ce.

The above phosphor may further comprise a red phosphor to emit light having the peak wavelength of at least 600 nm and not exceeding 700 nm by the above light-emitting body or the emission source.

The above red phosphor may be selected from $CaAlSiN_3$: Eu, $(Ca,Sr)AlSiN_3$:Eu, $Ca_2Si_5N_8$:Eu, and $Sr_2Si_5N_8$:Eu.

The above light-emitting body or the emission source may be an LED to emit light having the wavelength of at least 280 nm and not exceeding 450 nm.

The image display device according to the present invention comprises at least an excitation source and a phosphor and the phosphor comprises at least the above-described phosphor, thereby solving the above problem.

The image display device may comprise any one of a fluorescent display (VFD), a field emission display (FED), a plasma display panel (PDP), a cathode-ray tube (CRT), and a liquid crystal display (LCD).

The pigment according to the present invention comprises the above-described inorganic compound.

The ultraviolet absorber according to the present invention comprises the above-described inorganic compound.

Effect of the Invention

The phosphor of the present invention contains, as a main component, an inorganic compound comprising: a multinary nitride including a divalent element, a trivalent element, and a tervalent element; or a crystal represented by $BaSi_4Al_3N_9$ among a multinary oxynitride; an inorganic crystal having the same crystal structure as the crystal represented by $BaSi_4Al_3N_9$; or a solid-solution crystal of these, into which an activating ion is solid-solved. By configuring the phosphor as mentioned above, the phosphor exhibits emission of high brightness and the phosphor having a specific composition is excellent as a blue-to-green phosphor. Since the brightness of the phosphor of the present invention does not decrease even when exposed to the excitation source, there is provided a useful phosphor suitably used for a light-emitting device such as a white light-emitting diode, an illuminating device, a backlight source for a liquid crystal, VFD, FED, PDP, CRT or LCD. This phosphor is also suitable for a pigment since it has a white object color and for an ultraviolet absorver since it absorbs the ultraviolet ray.

EMBODIMENT FOR CARRYING OUT THE INVENTION

Hereafter, a phosphor according to the present invention is described in detail with reference to the drawings.

A phosphor according to the present invention may be a phosphor comprising, as a main component, an inorganic compound comprising: a crystal represented by $BaSi_4Al_3N_9$, an inorganic crystal having the same (or identical) crystal structure as the crystal represented by $BaSi_4Al_3N_9$, or a solid solution crystal of these, which comprises at least an A element, a D element, an E element, and an X element (here, A is one or two or more kinds of elements selected from the group consisting of Li, Mg, Ca, Sr, Ba, and La; D is one or two or more kinds of elements selected from the group consisting of Si, Ge, Sn, Ti, Zr, and Hf; E is one or two or more kinds of elements selected from the group consisting of B, Al, Ga, In, Sc, and Y; X is one or two or more kinds of elements selected from the group consisting of O, N, and F), where an M element is solid-solved into the crystal (here, M is one or two or more kinds of elements selected from the group consisting of Mn, Ce, Pr, Nd, Sm, Eu, Tb, Dy, and Yb), thereby allowing the phosphor to function as an excellent phosphor. Here, in the present specification, the crystal represented by $BaSi_4Al_3N_9$, the inorganic crystal having the same crystal structure as the crystal represented by $BaSi_4Al_3N_9$, or a solid solution crystal of these crystals may also be collectively referred to as "$BaSi_4Al_3N_9$ system crystal" for the sake of simplicity.

The crystal represented by $BaSi_4Al_3N_9$, which was newly synthesized and confirmed to be a new crystal through the crystal structure analysis by the present inventors, is a crystal which has not been reported prior to the present invention.

Figure 1:
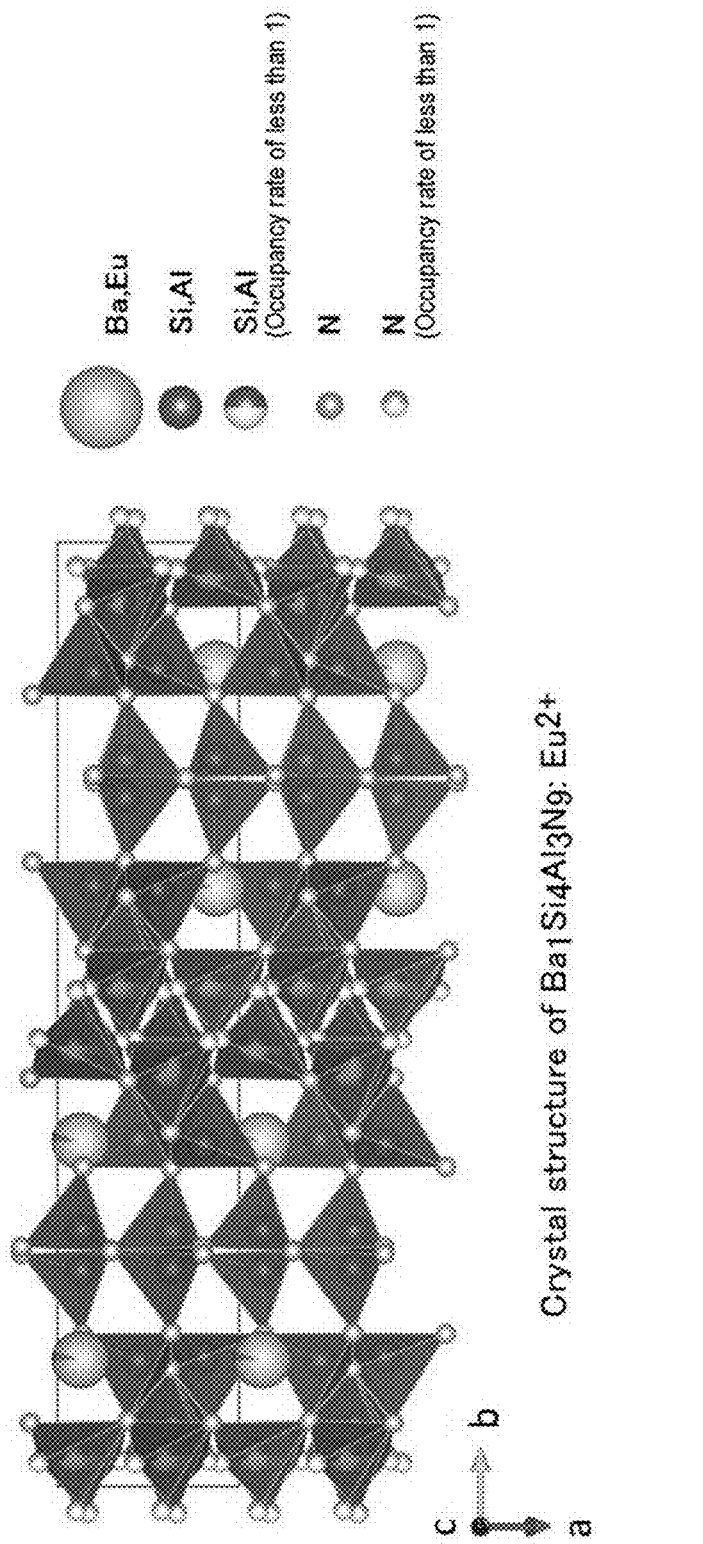
FIG. 1 shows a diagram illustrating a crystal structure of $BaSi_4Al_3N_9$:$Eu^{2+}$ crystal.

FIG. 1 shows a diagram illustrating a crystal structure of $BaSi_4Al_3N_9:Eu^{2+}$ crystal.

According to the single crystal structure analysis performed with respect to the $BaSi_4Al_3N_9:Eu^{2+}$ crystal synthesized by the present inventors, the $BaSi_4Al_3N_9:Eu^{2+}$ crystal belongs to the monoclinic system and the P2(1)/c space group (space group No. 14 in the International Tables for Crystallography), and has crystal parameters and occupancy of the atomic coordinate positions as shown in Table 1.

In Table 1, lattice constants a, b, and c signify respective lengths of the axes of the unit cell, and $\alpha$, $\beta$, and $\gamma$ signify respective angles between axes of the unit cell. The atomic coordinates indicate a position of each atom in the unit cell in terms of a value from 0 to 1 using the unit cell as a unit. According to the analysis results thus obtained, there were atoms of Ba, Si, Al, N, and Eu, respectively, and Ba and Eu interexchangeably existed in one kind of site: (Ba, Eu(1)). And the analysis results showed that Si and Al also interexchangeably existed in ten (10) kinds of sites from (Si, Al(2)) to (Si, Al(5)), (Si, Al(6A)) and (Si, Al(6B)), (Si, Al(7A)) and (Si, Al(7B)), (Si, Al(8A)) and (Si,Al(8B)). Further, the analysis results showed that N existed in eleven (11) kinds of sites from N(1) to N(7), N(8A) and N(8B), and N(9A) and N(9B).

TABLE 1

Crystal structure data of $BaSi_4Al_3N_9:Eu^{2+}$ crystal

| Crystal composition | | | $BaSi_4Al_3N_9:Eu^{2+}$ | |
|---|---|---|---|---|
| Formula weight (Z) | | | 1 | |
| Crystal system | | | Monoclinic | |
| Space group | | | P2(1)/c | |
| Space group number | | | 7 | |
| Lattice constants | | a | 5.8465 Å | |
| | | b | 26.7255 Å | |
| | | c | 5.8386 Å | |
| | | $\alpha$ | 90 degree | |
| | | $\beta$ | 118.897 degree | |
| | | $\gamma$ | 90 degree | |

| | Atomic coordinate | | | |
|---|---|---|---|---|
| Atom | x | y | z | Site occupancy rate |
| Ba,Eu(1) | 1.1274 | 0.1343 | 0.8732 | 1 |
| Si,Al(2) | 0.4477 | 0.1328 | 0.5539 | 1 |
| Si,Al(3) | 0.8037 | 0.1371 | 1.1931 | 1 |
| Si,Al(4) | 0.6291 | 0.2305 | 0.8674 | 1 |
| Si,Al(5) | 1.1318 | 0.2716 | 0.872 | 1 |
| Si,Al(6A) | 0.6509 | 0.0595 | 1.3483 | 0.706 |
| Si,Al(6B) | 0.6007 | 0.0589 | 1.3989 | 0.294 |
| Si,Al(7A) | 0.6604 | 0.0338 | 0.8365 | 0.5 |
| Si,Al(7B) | 0.5905 | 0.0327 | 0.9109 | 0.5 |
| Si,Al(8A) | 0.1631 | 0.0338 | 0.3403 | 0.5 |
| Si,Al(8B) | 1.0892 | 0.033 | 1.4096 | 0.5 |
| N(1) | 0.6277 | 0.1627 | 0.8587 | 1 |
| N(2) | 1.1386 | 0.3384 | 0.8766 | 1 |
| N(3) | 0.3879 | 0.0697 | 0.6143 | 1 |
| N(4) | 0.6214 | 0.1247 | 1.3755 | 1 |
| N(5) | 0.8486 | 0.0675 | 1.1504 | 1 |
| N(6) | 0.7996 | 0.2464 | 1.2054 | 1 |
| N(7) | 1.2948 | 0.2493 | 1.1993 | 1 |
| N(8A) | 0.5742 | −0.0251 | 0.8956 | 0.5 |
| N(8B) | 0.6564 | −0.0279 | 0.8317 | 0.5 |
| N(9A) | 1.105 | −0.0256 | 1.4265 | 0.5 |
| N(9B) | 0.1696 | −0.0278 | 0.3417 | 0.5 |

As a result of analysis using data in Table 1, the $BaSi_4Al_3N_9:Eu^{2+}$ crystal was found to have the structure as shown in FIG. 1, in which Ba element was included in a skeleton formed by linking tetrahedrons constituted of bonds of Si or Al and N. The M element to become an activating ion such as Eu and so on was incorporated into the crystal whereby Ba element is partially substituted.

As the crystal having the same crystal structure as the $BaSi_4Al_3N_9$ crystal that was synthesized and analyzed with respect to the structure, there are $A(D, E)_7X_9$ crystal, specifically, $A(Si, Al)_7 (O, N)_9$ crystal, and, more specifically, $ASi_4Al_3N_9$ crystal. The A element is typically Ba. With respect to $A(D, E)_7X_9$ crystal, A can occupy sites which Ba is supposed to occupy, D and E can interexchangeably occupy sites which Si and Al are supposed to occupy, and X can occupy sites which N is supposed to occupy, in the $BaSi_4Al_3N_9$ crystal. Thus, a relative ratio of numbers of atoms can be adjusted to be 1 for the A element, 7 for the sum of D and E, and 9 for the sum of X, while the crystal structure remains the same. However, it is desirable to have a ratio of cation such as A, D, and E to anion such as X satisfying an electrical neutrality condition in the crystal. With respect to $A_1(Si, Al)_7 (O, N)_9$ crystal, Si and Al can occupy sites which Si and Al are supposed to occupy without any distinction with each other, and O and N can occupy sites which N is supposed to occupy, in $BaSi_4Al_3N_9$ crystal. Thus, a relative ratio of numbers of atoms can be adjusted to be 1 for the A element, 7 for the sum of Si and Ai, and 9 for the sum of O and N, while the crystal structure remains the same. However, it is desirable to have such a ratio of Si/Al and a ratio of O/N as to satisfy the condition of the electrical neutrality in the crystal.

The $BaSi_4Al_3N_9$ system crystal of the present invention can be identified by means of the X-ray diffraction or the neutron diffraction. A substance exhibiting the identical diffraction to that of the $BaSi_4Al_3N_9$ system crystal as a result of the X-ray diffraction in the present invention includes a crystal designated by $A(D, E)_7X_9$. Further, the substance includes a crystal in which lattice constants or atomic positions are changed by substituting other elements for constituent elements in the $BaSi_4Al_3N_9$ crystal. Here, specific examples of materials in which the constituent elements are substituted with other elements include a material in which Ba in the $BaSi_4Al_3N_9$ crystal is partially or completely substituted with the A element other than Ba (here, A is one or two or more kinds of elements selected from Li, Mg, Ca, Sr, and La) and/or the M element (here, M is one or two or more kinds of elements selected from Mn, Ce, Pr, Nd, Sm, Eu, Tb, Dy, and Yb). Further, the specific examples include a material in which Si in the crystal is partially or completely substituted with the D element other than Si (here, D is one or two or more kinds of elements selected from Ge, Sn, Ti, Zr, and Hf). Further, the specific examples include a material in which Al in the crystal is partially or completely substituted with the E element other than Al (here, E is one or two or more kinds of elements selected from B, Ga, In, Sc, and Y). Further, the specific examples include a material in which N in the crystal is partially or completely substituted with oxygen and/or fluorine. These substitutions are performed such that the neutrality of charges in the whole crystal is maintained. The material in which a crystal structure thereof is not changed as a result of such element substitutions is included in the $BaSi_4Al_3N_9$ system crystal. Since emission characteristics, chemical stability, and thermal stability of the phosphor are changed by the substitution of elements, the substitution of elements may be selectively utilized at an appropriate time for each application thereof as far as the crystal structure remains the same.

In the $BaSi_4Al_3N_9$ system crystal, the lattice constants change as the constituent components are substituted with other elements or as an activating element such as Eu is solid-solved therein, but the atomic positions given by the crystal structure, sites to be occupied by atoms, and coordinates thereof do not significantly change to an extent in which a chemical bond between skeleton atoms is broken. In the present invention, a crystal structure is defined to be identical (or the same) to that of the $BaSi_4Al_3N_9$ crystal if lengths of chemical bonds (distance of neighboring atoms) of Al—N and Si—N calculated from the lattice constants and atomic coordinates obtained by conducting the Rietveld analysis of the results from the X-ray diffraction or the neutron diffraction in the space group of P2(1)/c are compared with lengths of chemical bonds calculated from the lattice constants and atomic coordinates of $BaSi_4Al_3N_9$: $Eu^{2+}$ crystal as shown in Table 1 such that each difference between corresponding lengths is within ±5%, and using the definition it is determined whether the crystal having the crystal structure belongs to the $BaSi_4Al_3N_9$ system crystal or not. This determination criterion is employed herein since it was confirmed that a crystal in the $BaSi_4Al_3N_9$ system crystal was changed to become another crystal due to breakage of chemical bonds when lengths of the chemical bonds were changed beyond ±5% according to the prior experiments.

Further, in case an amount of solid-solution is small, a simple method for determining whether it belongs to the $BaSi_4Al_3N_9$ system crystal or not is described as follows. A new substance can be identified to have the same crystal structure if main peaks of the resultant X-ray diffraction pattern measured with the new substance are respectively located at diffraction peak positions, which agree with the peak positions (2θ) of the diffraction pattern calculated using the crystal structure data of Table 1 and the lattice constants calculated from the resultant X-ray diffraction pattern.

Figure 2:
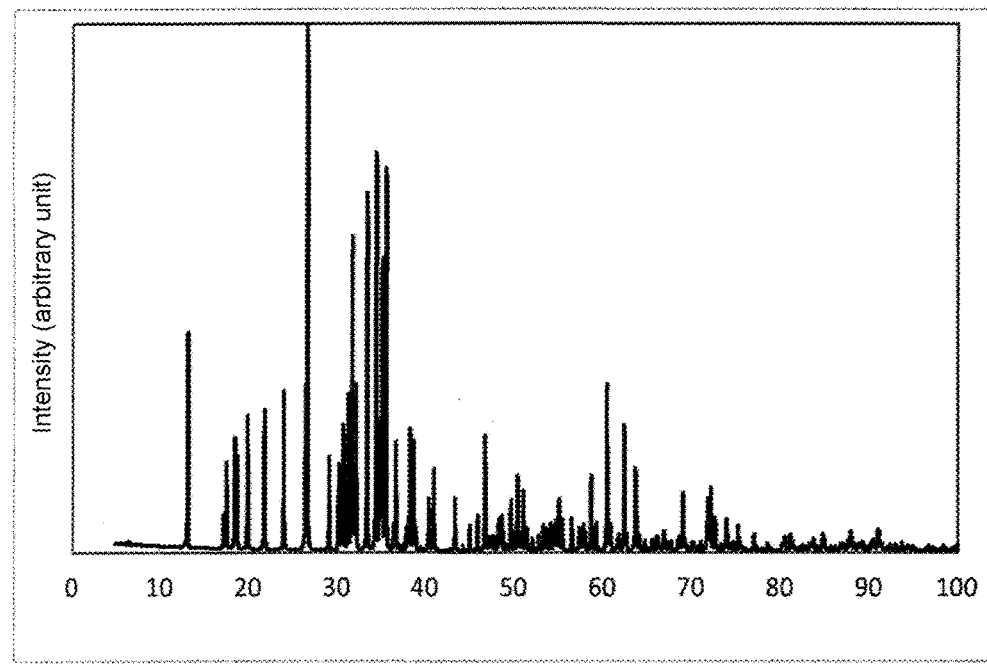
FIG. 2 shows a diagram showing a powder X-ray diffraction pattern using Cu Kα-line, calculated from a crystal structure of $BaSi_4Al_3N_9$ crystal.

FIG. 2 shows a diagram showing a powder X-ray diffraction pattern using Cu Kα-line calculated from the crystal structure of $BaSi_4Al_3N_9$ crystal.

It is possible to make a simple determination whether a subject substance belongs to the $BaSi_4Al_3N_9$ system crystal or not by comparing FIG. 2 and that of the subject substance. It may be good to make a judgment using approximately ten (10) peaks of the highest intensity in the diffraction pattern as the main peaks of the $BaSi_4Al_3N_9$ system crystal. Table 1 is important in this sense since it could be referenced when the identification of the $BaSi_4Al_3N_9$ system crystal is conducted. Further, it is also possible to define a crystal structure of the $BaSi_4Al_3N_9$ system crystal as an approximate structure using another crystal system of the monoclinic crystal and, in such a case, the crystal structure is expressed using a different space group, different lattice constants, and different plane indices, but the X-ray diffraction results (for example, FIG. 2) and the crystal structure (for example, FIG. 1) remain unchanged such that an identification method and an identification result thereof are the same. Therefore, in the present invention, it is to perform an X-ray diffraction analysis using the monoclinic system. The method of identifying the substance based on Table 1 will be concretely described in Examples to be described later, and the explanation of the method described herein is just in general.

A phosphor can be obtained if the $BaSi_4Al_3N_9$ system crystal is activated by the M element, one or two or more kinds of which are selected from Mn, Ce, Pr, Nd, Sm, Eu, Tb, Dy, Ho, Er, Tm, and Yb. Since emission characteristics such as an excitation wavelength, an emission wavelength, and emission intensity may vary depending on the composition of the $BaSi_4Al_3N_9$ system crystal, and the kind and quantity of the activating element, such conditions may be chosen in accordance with an application thereof.

With respect to a crystal represented by $A(D, E)_7X_9$, if the crystal has a composition in which, at least, the A element includes at least one element selected from the group consisting of Li, Mg, Ca, Sr, Ba, and La; the D element includes Si; the E element includes Al; and the X element includes N, and the X element includes O if necessary, then the crystal exhibits high emission intensity. In particular, it is the phosphor exhibiting high emission intensity that comprises the $BaSi_4Al_3N_9$ system crystal as the host and has a composition in which A is a mixture of Ba and Mg or a mixture of Ba and Li; D is Si; E is Al; and X is N or a combination of O and N.

The phosphor has a stable crystal and exhibits high emission intensity if the inorganic crystal thereof having the same crystal structure as the crystal represented by $BaSi_4Al_3N_9$ may be $BaSi_4Al_3N_9$, $MgSi_4Al_3N_9$, $CaSi_4Al_3N_9$, $SrSi_4Al_3N_9$, $LaSi_4Al_3N_9$, $LiSi_4Al_3N_9$, $(Ba,Mg)Si_4Al_3N_9$, $(Ba,Ca)Si_4Al_3N_9$, $(Ba,Sr)Si_4Al_3N_9$, $(Ba,La)Si_4Al_3N_9$, or $(Ba,Li)Si_4Al_3N_9$.

The phosphor exhibits high emission intensity and is a phosphor in which the change of color tone can be controlled by changing the composition thereof if the inorganic crystal thereof having the same crystal structure as the crystal represented by $BaSi_4Al_3N_9$ may be represented by a composition formula of: $BaSi_{4-p}Al_{3+p}O_pN_{9-p}$, $MgSi_{4-p}Al_{3+p}O_pN_{9-p}$, $CaSi_{4-p}Al_{3+p}O_pN_{9-p}$, $SrSi_{4-p}Al_{3+p}O_pN_{9-p}$, $LaSi_{4-p}Al_{3+p}O_pN_{9-p}$, $LiSi_{4-p}Al_{3+p}O_pN_{9-p}$, $(Ba,Mg)Si_{4-p}$ $Al_{3+p}O_pN_{9-p}$, $(Ba,Ca)Si_{4-p}Al_{3+p}O_pN_{9-p}$, $(Ba,Sr)Si_{4-p}Al_{3+p}O_pN_{9-p}$, $(Ba,La)Si_{4-p}Al_{3+p}O_pN_{9-p}$, or $(Ba,Li)Si_{4-p}Al_{3+p}O_pN_{9-p}$ (where $0 \leq p < 4$).

It is Eu that is used as the activating element M such that a phosphor exhibiting particularly high emission intensity can be obtained.

In an inorganic crystal having a crystal structure identical to that of the crystal represented by $BaSi_4Al_3N_9$, the inorganic crystal is particularly stable if the inorganic crystal is a crystal that belongs to the monoclinic system, and a phosphor having such crystal as a host crystal exhibits high emission intensity.

Further, if an inorganic crystal having a crystal structure identical to that of the crystal represented by $BaSi_4Al_3N_9$ is a crystal that belongs to the monoclinic system and has the symmetry of space group P2(1)/c, and in which lattice constants thereof a, b, and c are in the following ranges:
a=0.58465±0.05 nm,
b=2.67255±0.05 nm, and
c=0.58386±0.05 nm,
the crystal is particularly stable such that a phosphor having the crystal as a host crystal exhibits high emission intensity. If the crystal is prepared out of the above ranges, the crystal may become unstable and the emission intensity may occasionally decrease.

If the above-described inorganic compound is represented by a composition formula $M_dA_eD_fE_gX_h$ (here, in the formula, d+e+f+g+h=1, M is one or two or more kinds of elements selected from Mn, Ce, Pr, Nd, Sm, Eu, Tb, Dy, and Yb; A is one or two or more kinds of elements selected from. Li, Mg, Ca, Sr, Ba, and La; D is one or two or more kinds of elements selected from Si, Ge, Sn, Ti, Zr, and Hf; E is one or two or more kinds of elements selected from B, Al, Ga, In, Sc, and Y; X is one or two or more kinds of elements selected from O, N, and F), and parameters d, e, f, g, and h thereof satisfy all the following conditions:
$0.00001 \leq d \leq 0.05$;
$0.01 \leq e \leq 0.07$;
$0.10 \leq f \leq 0.30$;
$0.10 \leq g \leq 0.30$; and
$0.45 \leq h \leq 0.65$,
the phosphor comprising the inorganic compound exhibits particularly high emission intensity.

The parameter d represents an additive amount of the activating element, and if the amount is less than 0.00001, an amount of light-emitting ions is insufficient such that brightness thereof may be decreased. If the amount of parameter d is more than 0.05, the emission intensity may be decreased due to the concentration quenching by a mutual interaction between light-emitting ions. The parameter e is a parameter representing a constituent amount of the A element such as Ba, and if the amount is less than 0.01 or higher than 0.7, the crystal structure may become unstable so as to cause the emission intensity to decrease. The parameter f is a parameter representing a constituent amount of the D element such as Si, and if the amount is less than 0.10 or higher than 0.3, the crystal structure may become unstable so as to cause the emission intensity to decrease. The parameter g is a parameter representing a constituent amount of the E element such as Al, and if the amount is less than 0.10 or higher than 0.3, the crystal structure may become unstable so as to cause the emission intensity to decrease. The parameter h is a parameter representing a constituent amount of the X element such as O, N, and F, and if the amount is less than 0.45 or higher than 0.65, the crystal structure may become unstable so as to cause the emission intensity to decrease. The element X is an anion, and composition ratios of O, N, and F may be determined so as to maintain the charge neutrality with cations of the A, M, D and E elements.

The crystal, in which values of the parameters d, e, f, g, and h satisfy all the following conditions:
d+e=(1/17)±0.05,
f+g=(7/17)±0.05, and
h=(9/17)±0.05,
is stable in the crystal structure and exhibits particularly high emission intensity. In particular, the crystal, in which the values satisfy all the following conditions:
d+e=1/17;
f+g=7/17; and
h=9/17,
that is to say, the crystal having the composition of $(M,A)(D,E)_7X_9$, is especially stable in the crystal structure and exhibits particularly high emission intensity.

Further, the crystal having the composition, in which the parameters f and g satisfy the condition:
$0 < f/(f+g) \leq 1$,
is stable in the crystal structure and exhibits high emission intensity. More preferably, the crystal having the composition, in which the parameters f and g satisfy the condition:
$2/7 \leq f/(f+g) \leq 4/7$,
is more stable in the crystal structure and exhibits higher emission intensity.

With respect to the above-described composition formula, if the X element includes N and O, and if the inorganic compound is represented by the composition formula of $M_dA_eD_fE_gO_{h1}N_{h2}$ (where d+e+f+g+h1+h2=1 and h1+h2=h) and the composition satisfies the condition of
$0 < h1/(h1+h2) \leq 6/9$,
the inorganic compound is stable in the crystal structure and exhibits high emission intensity. More preferably, the composition, in which the parameters h1 and h2 satisfy the condition of
$0 < h1/(h1+h2) \leq 2/9$,
may be expected to have more stable crystal structure and exhibit higher emission intensity.

With respect to the above-described composition formula, a phosphor including at least Eu as the M element being the activating element is a phosphor exhibiting high emission intensity among the phosphors of the present invention, and a blue-to-green phosphor may be obtained with a specific composition.

With respect to the above-described composition formula, a phosphor having a composition, in which at least Ba is included as the A element; at least Si is included as the D element; at least Al is included as the E element; and at least N is included as the X element, has a stable crystal structure and emission intensity thereof is high.

Further, the phosphor may also include boron as the E element, and, in this case, the content amount of boron is at least 0.001 mass % and not exceeding 1 mass %. In this way, the emission intensity could become high.

The phosphor represented by the composition formula of, using the parameters p and q, $Eu_qBa_{1-q}Si_{4-p}Al_{3+p}N_{9-p}O_p$ where
$0 \leq p < 4$ and
$0.0001 \leq q < 1$,
may keep a stable crystal structure while the ratios of Eu/Ba; Si/Al; and N/O can be changed in the composition range in which the parameters p and q are changed. Thus, it is a phosphor that is easy to make a material design since an excitation wavelength thereof or an emission wavelength thereof can be continuously changed by utilizing this feature.

A phosphor including an inorganic compound which comprises single crystal particles or an agglomeration of the single crystals particles having a mean particle diameter of at least 0.1 μm and not exceeding 20 μm has high emission efficiency and a good handling property when it is implemented into an LED such that it is good to control the particle diameter thereof in this range.

Impurity elements of Fe, Co, and Ni included in the inorganic compound may cause the emission intensity to decrease. If the sum of these impurity elements in the phosphor is controlled to be 500 ppm or less, an influence of these elements on the emission intensity is decreased.

As one of the embodiments of the present invention, there is provided a phosphor of the present invention comprising an inorganic compound including the $BaSi_4Al_3N_9$ system crystal, as the host, into which the activating ion M is solid-solved, and further including an amorphous phase or another crystal phase other than the inorganic compound such that the content amount of the inorganic compound is at least 20 mass %. In the case where target characteristics cannot be obtained with a single phosphor of the $BaSi_4Al_3N_9$ system crystal by itself, or in the case where an additional function such as conductivity is added, the phosphor of the present embodiment may be utilized. The content amount of the $BaSi_4Al_3N_9$ system crystal may be adjusted in accordance with the target characteristics, but the emission intensity of the phosphor may be lowered if the content amount is equal to or less than 20 mass %. From this perspective, it is preferable to have 20 mass % or more of the main component of the above-described inorganic compound in the phosphor of the present invention.

In the case where the phosphor is supposed to need electrical conductivity in an application in which electron beam excitation or the like is employed, an inorganic substance having electrical conductivity may be added thereto as another crystal phase or an amorphous phase.

As the inorganic substance having the electrical conductivity, oxide, oxynitride, nitride, or a combination thereof of one or more kinds of elements selected from Zn, Al, Ga, In, and Sn may be named. For example, zinc oxide, aluminum nitride, indium nitride, tin oxide, and so on may be named.

In the case where a target emission spectrum cannot be achieved with a single phosphor of the $BaSi_4Al_3N_9$ system crystal, a second phosphor other than the phosphor of the $BaSi_4Al_3N_9$ system crystal may be added. As an example of the other phosphor, an inorganic phosphor such as a BAM phosphor, a β-sialon phosphor, an α-sialon phosphor, a $(Sr,Ba)_2Si_5N_8$ phosphor, a $CaAlSiN_3$ phosphor, and a $(Ca,Sr)AlSiN_3$ phosphor may be named. The other crystal phase or the amorphous phase may be the above-described inorganic phosphor.

As one of the embodiments of the present invention, there is a phosphor having a peak at a wavelength in the range of at least 450 nm and not exceeding 530 nm by irradiation of an excitation source. For example, a phosphor of the $BaSi_4Al_3N_9$ system crystal in which Eu is activated has an emission peak in this range by adjusting the composition.

As one of the embodiments of the present invention, there is a phosphor emitting light with vacuum ultraviolet light, ultraviolet light, or visible light having a wavelength of at least 100 nm and less than 450 nm, or electron beam or X-ray as an excitation source. The phosphor can be made to emit light efficiently by using such excitation sources.

As one of the embodiments of the present invention, there is a phosphor comprising an inorganic crystal, into which Eu is solid-solved, wherein the inorganic crystal has the same crystal structure as the crystal represented by $BaSi_4Al_3N_9$. Since the phosphor emits blue-to-green fluorescence of at least 450 nm and not exceeding 530 nm by adjusting the composition upon irradiation of light from 280 nm to 405 nm, the phosphor is desirable for use in blue-to-green emission application such as white color LED.

As one of the embodiments of the present invention, there is a phosphor, upon irradiation of the excitation source, to emit light of a specific color which satisfies, in terms of values of (x, y) of CIE 1931 chromaticity coordinates, the following conditions:
$0 \leq x \leq 0.4$; and
$0 \leq y \leq 0.9$.
For example, a phosphor to emit light of the color in the range of the chromaticity coordinates can be obtained by adjusting the composition of

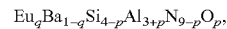

wherein
$0 \leq p < 4$ and
$0.0001 \leq q < 1$.
The phosphor is desirable for use in blue-to-green emission application such as white color LED.

As mentioned above, the phosphor of the present invention is characterized in that a wide range of excitation source such as electron beam, X-ray, and light from an ultraviolet ray to visible light are applicable; that blue-to-green color light of at least 450 nm and not exceeding 530 nm is emitted with a specific composition thereof; and that the emission wavelength and the emission peak width may be adjustable. Thus, the phosphor of the present invention is suitable for an illuminating device and an image display device because of such emission characteristics. The phosphor of the present invention has also advantages of excellent heat resistance since it does not degrade even if it is exposed to high temperature, and excellent long-term stability under an oxidizing atmosphere and a moisture environment, and thus a product having excellent durability can be provided by utilizing the phosphor.

The method of manufacturing such a phosphor of the present invention is not particularly limited thereto, but, for example, such a phosphor can be obtained by firing a mixture of metal compounds of a raw material mixture in a nitrogen-containing inert atmosphere in the temperature range of at least 1,200° C. and not exceeding 2,200° C. wherein the raw material mixture could constitute an inorganic compound having the $BaSi_4Al_3N_9$ system crystal as the host crystal, into which the activating ion M is solid-solved. While the main crystal of the present invention belongs to the monoclinic system and the space group P2(1)/c, another crystal that belongs to another crystal system and another space group other than the above may be occasionally mixed therein depending on synthesis conditions such as firing temperature. However, even in such a case, a change of the emission characteristics is slight and therefore the thus-obtained product can be used as a phosphor of high brightness.

As a starting material, for example, a mixture of metal compounds, which comprises a compound including M, a compound including A, a compound including D, a compound including E, and a compound including X (where M is one or two or more kinds of elements selected from Mn, Ce, Pr, Nd, Sm, Eu, Tb, Dy, and Yb; A is one or two or more kinds of elements selected from Li, Mg, Ca, Sr, Ba, and La;

D is one or two or more kinds of elements selected from Si, Ge, Sn, Ti, Zr, and Hf; E is one or two or more kinds of elements selected from B, Al, Ga, In, Sc, and Y; and X is one or two or more kinds of elements selected from O, N, and F), may be satisfactorily used.

As the starting material, the compound including M that is a single kind of substance or a mixture of at least two kinds of substances selected from the group consisting of metal, silicide, oxide, carbonate, nitride, oxynitride, chloride, fluoride and oxyfluoride, each of which includes M; the compound including A that is a single kind of substance or a mixture of at least two kinds of substances selected from the group consisting of metal, silicide, oxide, carbonate, nitride, oxynitride, chloride, fluoride, and oxyfluoride, each of which includes A; the compound including D that is a single kind of substance or a mixture of at least two kinds of substances selected from the group consisting of metal, silicide, oxide, carbonate, nitride, oxynitride, chloride, fluoride, and oxyfluoride, each of which includes D; and the compound including E that is a single kind of substance or a mixture of at least two kinds of substances selected from the group consisting of metal, silicide, oxide, carbonate, nitride, oxynitride, chloride, fluoride, and oxyfluoride, each of which includes E are desirable because they are easily available and have excellent stability. The compound including X that is a single substance or a mixture of at least two kinds of substances selected from the group consisting of oxide, nitride, oxynitride, fluoride, and oxyfluoride is desirable because the raw material is easily available and has excellent stability.

In the case where a phosphor of the $BaSi_4Al_3N_9$ crystal system activated by Eu is manufactured, it is preferable to use a starting material comprising, at least, nitride or oxide of europium; nitride, oxide, or carbonate of barium; silicon oxide or silicon nitride; and aluminum oxide or aluminum nitride since the reaction tends to easily proceed during the firing.

Since the firing temperature is high and the firing atmosphere is an inert atmosphere containing nitrogen, an electric furnace of a metal resistance heating type or a graphite resistance heating type, in which a high temperature member of the furnace made of carbon is used, is suitable as a furnace for firing.

The pressure range of the nitrogen-containing inert atmosphere is preferably in the range of at least 0.1 MPa and not exceeding 100 MPa because thermal decomposition of nitride or oxynitride of the starting material or the product thereof is suppressed. The nitrogen-containing inert atmosphere is preferably a nitrogen gas atmosphere. It is preferable that the oxygen partial pressure is 0.0001% or less in the firing atmosphere in order to suppress the oxidation reaction of nitride or oxynitride of the starting material or the product thereof.

Here, the firing time is, although it differs depending on the firing temperature, usually 1 to 10 hours or so.

In order to manufacture the phosphor in the form of powder or agglomeration, it would be preferable to utilize a method of firing raw materials after the raw materials are filled in a container with a filling rate kept at the bulk density of 40% or lower. It is possible to prevent particles from adhering with each other by maintaining the bulk density of 40% or lower in the filling rate. Here, the term relative bulk density means the ratio of a value (bulk density) given by dividing the mass of powder material filled in the container by the capacity of the container to the real density of the substance of the powder material. Unless otherwise noted, the relative bulk density is referred to as simply the bulk density.

Various kinds of heat-resistant materials can be used for the container containing the mixture in firing the mixture of metal compounds. However, in view of a low adverse effect of material deterioration on the metal nitride used in the present invention, a container made of boron nitride material such as sintered boron nitride body or a boron nitride coated container, which is exemplified by a boron nitride coated graphite crucible used for synthesis of an α-sialon as described in a scientific journal of "Journal of the American Ceramic Society" Vol. 85, No. 5, pages 1229 to 1234 in 2002. When the firing is performed under such conditions, boron or boron nitride component is mixed into the product from the container, but, if the amount thereof is small, an effect of mixing is slight since the emission characteristics are not deteriorated. Further, durability of the product may be occasionally improved by the addition of a small amount of boron nitride thereto, and such addition may be preferable in some cases.

In order to manufacture the phosphor in the form of powder or agglomeration, the mixture of metal compounds is in a powder form or an agglomeration form and it is preferable to make the mean particle diameter of these equal to or less than 500 μm since the mixture has excellent reactivity and handling characteristics.

As a method of adjusting a particle size of the particle or agglomeration to be 500 μm or less, it is preferable to employ a spray dryer, sieving, or pneumatic classification since such a method has excellent operating efficiency and handling characteristics.

In order to manufacture a phosphor in a powder form or an agglomeration form, it is preferable to employ a method of firing in which no external mechanical pressing is applied such as a pressureless sintering method and a gas pressure sintering method, but not a hot-pressing method.

A mean particle diameter of phosphor powder is preferably 50 nm or more and 200 μm or less in terms of a volume-based median diameter (d50) because the emission intensity is high. The volume-based mean particle diameter can be measured, for example, by a Microtrac or a laser light scattering method. A mean particle diameter of phosphor powder synthesized by firing may be satisfactorily adjusted to be at least 50 nm and not exceeding 200 μm by applying at least one technique selected from pulverization, classification, and acid treatment.

A defect included in powder and a damage caused by pulverization may be occasionally cured by heat-treating a phosphor powder after firing, a phosphor powder after pulverizing treatment, or a phosphor powder after adjusting a particle size at a temperature of at least 1,000° C. and not exceeding the firing temperature. The defect or damage may occasionally cause a decrease in the emission intensity, but the emission intensity recovers by the heat treatment.

In the case of firing for synthesis of the phosphor, an inorganic compound to form a liquid phase at a temperature of a firing temperature or lower may be added and the firing is conducted. The inorganic compound to form the liquid phase may serve as a flux to promote the reaction and particle growth such that a stable crystal may be obtained and that the emission intensity may be occasionally improved.

The inorganic compound to form the liquid phase at the temperature of the firing temperature or lower may include a single kind of or a mixture of two or more kinds of fluoride, chloride, iodide, bromide, or phosphate of one or two or more kinds of elements selected from Li, Na, K, Mg, Ca, Sr, and Ba. The inorganic compounds have different melting points, respectively, and therefore may be satisfactorily used properly depending on a synthesizing temperature.

Further, the content amount of the inorganic compound forming the liquid phase at the temperature of the firing temperature or lower is decreased by washing the phosphor with a solvent after the firing. Thus, the emission intensity of the phosphor may occasionally become high.

When the phosphor of the present invention is used in an application of a light-emitting device or the like, it is preferable to use the phosphor dispersed in a liquid medium. Further, the phosphor can also be used in the form of a phosphor mixture containing the phosphor of the present invention. A composition prepared by dispersing the phosphor of the present invention in the liquid medium is referred to as a phosphor-containing composition.

As the liquid medium that can be used for the phosphor-containing composition of the present invention, any liquid medium can be selected depending on a purpose or the like, if the liquid medium shows liquid properties under desired use conditions to suitably disperse the phosphor of the present invention, and simultaneously does not cause an undesirable reaction or the like. As examples of the liquid medium, an addition reaction type silicone resin and a condensation reaction type silicone resin before curing, a modified silicone resin, an epoxy resin, a polyvinyl resin, a polyethylene resin, a polypropylene resin, a polyester resin, and so on are named. With respect to the liquid media, a single kind of liquid medium may be used by itself, or any combination of two or more kinds of liquid media with any combination ratio thereof may be used.

An amount of used liquid medium or media may be appropriately adjusted depending on an application or the like. In general, the amount is in the range of generally 3 wt % or more and preferably 5 wt % or more, to generally 30 wt % or less and preferably 15 wt % or less in terms of the weight ratio of the liquid medium to the phosphor of the present invention.

Further, the phosphor-containing composition of the present invention may contain, in addition to the phosphor and the liquid medium, any other component depending on an application or the like. As examples of the other component, a dispersing agent, a thickening agent, an extending agent, a buffering agent, and so on are named. Specifically, silica fine powder such as Aerosil, alumina, and so on may be named.

The light-emitting device of the present invention comprises at least a light-emitting body or an emission source, and the phosphor wherein the phosphor includes at least the above-described phosphor of the present invention.

As the light-emitting body or the emission source, there are an light-emitting diode (LED) light-emitting instrument, a laser diode (LD) light-emitting instrument, a semiconductor laser, an organic EL light-emitting body (OLED), a fluorescent lamp, and so on. The LED light-emitting device can be manufactured using the phosphor of the present invention and by a publicly known method which is described in Japanese Patent Application Publication No. H05(1993)-152609, Japanese Patent Application Publication No. H07(1995)-99345, Japanese Patent No. 2927279, or the like. In this case, the light-emitting body or the emission source is preferably what emits light of a wavelength from 280 nm to 450 nm. In particular, an LED light-emitting element emitting an ultraviolet (or violet) ray of a wavelength from 280 nm to 405 nm, or an LED light-emitting element emitting blue light in a wavelength from 405 nm to 450 nm is preferable. Such LED light-emitting elements include a nitride semiconductor such as GaN or InGaN, which can be an emission source of a predetermined wavelength by adjusting the composition.

As a light-emitting device of the present invention, there are a white light-emitting diode, an illuminating device including a plurality of white light-emitting diodes, a backlight for a liquid crystal panel, and the like, which include the phosphor of the present invention, respectively.

In such light-emitting devices, in addition to the phosphor of the present invention, the device may further include one or two or more kinds of phosphors selected from β-sialon phosphor activated with Eu, α-sialon yellow phosphor activated with Eu, $Sr_2Si_5N_8$ orange phosphor activated with Eu, (Ca,Sr)AlSiN$_3$ orange phosphor activated with Eu, and CaAlSiN$_3$ red phosphor activated with Eu. As the yellow phosphor other than the above, for example, YAG:Ce, (Ca,Sr,Ba)Si$_2$O$_2$N$_2$:Eu, and the like may be used.

As one aspect of the light-emitting device of the present invention, there is a light-emitting device in which a light-emitting body or an emission source emits ultraviolet light or visible light having a peak wavelength of at least 280 nm and less than 450 nm such that the phosphor of the present invention emits light of blue-to-green color, which is mixed with light having a wavelength of at least 450 nm emitted by another phosphor of the present invention such that the light-emitting device emits light of a white color or light of another color other than the white color.

As one aspect of the light-emitting device of the present invention, in addition to the phosphor of the present invention, a blue phosphor emitting light having a peak wavelength of at least 420 nm and not exceeding 500 nm by means of the light-emitting body or the emission source can further be included. As examples of such a blue phosphor, there are AlN:(Eu,Si), BaMgAl$_{10}$O$_{17}$:Eu, SrSi$_9$Al$_{19}$O$_{31}$:Eu, LaSi$_9$Al$_{19}$N$_{32}$:Eu, α-sialon:Ce, JEM:Ce, and so on.

As one aspect of the light-emitting device of the present invention, in addition to the phosphor of the present invention, a green phosphor emitting light having a peak wavelength of at least 500 nm and not exceeding 550 nm by means of the light-emitting body or the emission source can further be included. As examples of such a green phosphor, there are β-sialon:Eu, (Ba,Sr,Ca,Mg)$_2$SiO$_4$:Eu, (Ca,Sr,Ba)Si$_2$O$_2$N$_2$:Eu, and so on.

As one aspect of the light-emitting device of the present invention, in addition to the phosphor of the present invention, a yellow phosphor emitting light having a peak wavelength of at least 550 nm and not exceeding 600 nm by means of the light-emitting body or the emission source can further be included. As examples of such a yellow phosphor, there are YAG:Ce, α-sialon:Eu, CaAlSiN$_3$:Ce, La$_3$Si$_6$N$_{11}$:Ce, and so on.

As one aspect of the light-emitting device of the present invention, in addition to the phosphor of the present invention, a red phosphor emitting light having a peak wavelength of at least 600 nm and not exceeding 700 nm by means of the light-emitting body or the emission source can further be included. As examples of such a red phosphor, there are CaAlSiN$_3$:Eu, (Ca,Sr)AlSiN$_3$:Eu, Ca$_2$Si$_5$N$_8$:Eu, Sr$_2$Si$_5$N$_8$:Eu, and so on.

As one aspect of the light-emitting device of the present invention, a light-emitting device with high efficiency can be configured since the emission efficiency is high if an LED in which the light-emitting body or the emission source emits light having a wavelength of at least 280 nm and less than 450 nm is used.

An image display device of the present invention comprises at least an excitation source and a phosphor and the phosphor comprises at least the above-described phosphor of the present invention.

As the image display device, there are a fluorescent display (VFD), a field emission display (FED), a plasma display panel (PDP), a cathode-ray tube (CRT), a liquid crystal display (LCD), and so on. It has been confirmed that the phosphor of the present invention emits light by excitation of a vacuum ultraviolet ray of 100 to 190 nm, an ultraviolet ray of 190 to 380 nm, an electron beam, or the like, and the above image display devices can be configured by combining these excitation sources and the phosphor of the present invention.

The phosphor of the present invention comprising, as the main component, an inorganic compound having a specific chemical composition has a white color as an object color, and thus can be used as a pigment or fluorescent pigment. That is, the object color of white is observed when the phosphor of the present invention is irradiated with sunlight or light from a fluorescent lamp or the like. In view of a good coloring and no degradation over a long period of time, the phosphor of the present invention is suitable for an inorganic pigment. Therefore, when the phosphor of the present invention is used for a paint, ink, color, glaze, colorant to be added to a plastic product or the like, a favorable coloring can be maintained at a high level for a long period of time.

The phosphor of the present invention absorbs ultraviolet ray so as to be suitable also as the ultraviolet absorber. Thus, when the phosphor of the present invention is used as the paint or applied onto a surface of the plastic product or kneaded into an inside thereof, a shielding effect thereof against the ultraviolet ray is so high that the product may be effectively protected from the ultraviolet degradation.

EXAMPLE

The present invention will be described in more detail with reference to the examples to be shown below, but these examples are disclosed only for the purpose of facilitating understanding of the present invention readily such that the present invention is not limited to these examples.

[Raw Materials Used for Synthesis]

The raw material powders used for the synthesis were: silicon nitride powder with a particle size of specific surface area of 11.2 m$^2$/g, oxygen content of 1.29 wt %, and a type content of 95% (SN-E10 grade made by Ube Industries, Ltd.); aluminum nitride powder with a particle size of specific surface area of 3.3 m$^2$/g and oxygen content of 0.82 wt % (E-Grade made by Tokuyama Corporation); aluminum oxide powder with a particle size of specific surface area of 13.2 m$^2$/g (TAIMICRON made by Taimei Chemicals Co., Ltd.); lithium nitride powder (Li$_3$N; made by Kojundo Chemical Laboratory Co., Ltd.); magnesium nitride powder (Mg$_3$N$_2$; made by Kojundo Chemical Laboratory Co., Ltd.); strontium nitride powder of 99.5% purity (Sr$_3$N$_2$; made by CERAC, Inc.); barium nitride powder of 99.7% purity (Ba$_3$N$_2$; made by CERAC, Inc.); europium nitride (EuN; obtained by nitriding metal through heating metal europium in an ammonia vapor flow at 800° C. for 10 hours); and lanthanum nitride (LaN; made by Kojundo Chemical Laboratory Co., Ltd.).

[Synthesis and Structure Analysis of Crystal of the Present Invention]

A mixture composition of silicon nitride (Si$_3$N$_4$), barium nitride (Ba$_3$N$_2$), aluminum nitride (AlN), europium nitride (EuN) in the molar ratios of 1.33:0.33:3:0.02 was designed.

These raw material powders were weighed to be the above-mentioned mixture composition, and mixed for 5 minutes using a pestle and a mortar, each of them being made of sintered silicon nitride body. Next, the thus-obtained powder mixture was fed into a crucible made of sintered boron nitride body. A bulk density of the powder mixture (powder) was approximately 30%.

The crucible containing the powder mixture was set into an electric furnace of a graphite resistance heating type. In the firing operation, first the firing atmosphere was made vacuum of $1 \times 10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised to 2000° C. at a rate of 500° C. per hour, and then the temperature was maintained for two (2) hours.

A synthesized material was observed by means of an optical microscope and a crystal particle having a size of 80 μm×50 μm×3 μm was collected out of the synthesized material. The crystal particle was analyzed using a scanning electron microscope (SEM; SU1510 made by Hitachi High-Technologies Corp.) equipped with an energy dispersive elemental analyzer (EDS; QUANTAX made by Bruker AXS Inc.) so as to perform the elemental analysis for the elements included in the crystal particle. As a result, presence of Ba, Si, Al, N, and Eu elements was confirmed, and ratios of the respective number of contained atoms of Ba, Si, and Al were measured to be 1:4:3.

Next, the crystal was fixed to a tip top of a glass fiber with an organic adhesive. An X-ray diffraction measurement of the crystal was performed under a condition in which an output of an X-ray source was 50 kV and 50 mA using a single crystal X-ray diffractometer with a rotating target of Mo Kα-line (SMART APEX II Ultra made by Bruker AXS Inc.). As a result, the crystal particle was confirmed to be a single crystal.

Next, the crystal structure was determined using a single crystal structure analysis software (APEX2 made by Bruker AXS Inc.) from the results of X-ray diffraction measurement. The crystal structure data thus-obtained are shown in Table 1, and a diagram of the crystal structure is shown in FIG. 1. The crystal system, the space group, the lattice constants, and the kinds and positions of atoms are described in Table 1, and the shape and the size of the unit cell and the arrangement of atoms therein can be determined using the data. In addition, Si and Al enter in equivalent atom positions with a certain ratio, and oxygen and nitrogen enter in equivalent atom positions at a certain ratio, and when the ratios are averaged as a whole, the averaged ratio matches the composition fractions of the crystal.

It was found that this crystal belonged to the monoclinic system, and belonged to the space group P2(1)/C, (space group No. 14 of the International Tables for Crystallography), and the lattice constants a, b, and c were determined as follows:

a=0.58465 nm;
b=2.67255 nm;
c=0.58386 nm;
angle α=90°;
β=118.897°; and
γ=90°.

Further, the atom positions were determined as shown in Table 1. Here, in the table, Si and Ai exist in the equivalent atom positions with a certain ratio which should be determined by the composition thereof. Also, while oxygen and nitrogen can occupy the sites which X is supposed to occupy in the sialon system crystal in general, since Ba is divalent (+2), Al is trivalent (+3), and Si is tetravalent (+4), if the atomic positions and an amount ratio of Ba, Al, and Si are given, the ratio of O and N which occupy (O, N) positions can be determined from the condition of the electrical neutrality of the crystal. This crystal obtained from the ratios of Ba:Si:Al measured by the EDS and the crystal structure data was $BaSi_4Al_3N_9:Eu^{2+}$ crystal, that is, the $BaSi_4Al_3N_9$ crystal into which $Eu^{2+}$ was solid-solved. Further, a difference between the starting material composition and the crystal composition might has been caused by formation of a small amount of a second phase having a composition other than $BaSi_4Al_3N_9$. However, the analysis results show a structure of pure $BaSi_4Al_3N_9$ because the single crystal was used in the measurement.

When a similar composition thereof was examined, the $BaSi_4Al_3N_9$ crystal was found to allow Li, Mg, Ca, Sr, or La to substitute partially or entirely Ba while the crystal structure remains the same. More specifically, the crystal of $ASi_4Al_3N_9$ (A is one or two kinds of elements selected from Li, Mg, Ca, Sr, Ba and La) has a crystal structure identical to the crystal structure of the $BaSi_4Al_3N_9$ crystal. Further, it was confirmed that Al could substitute partially Si, Si could substitute partially Al, and oxygen could substitute partially N, and that the crystal was one of the compositions of the crystal group having the same crystal structure as $BaSi_4Al_3N_9$. From the condition of the electrical neutrality, it could also be described as the compositions represented by $BaSi_{4-p}Al_{3+p}O_pN_{9-p}$, $MgSi_{4-p}Al_{3+p}O_pN_{9-p}$, $CaSi_{4-p}Al_{3+p}O_pN_{9-p}$, $SrSi_{4-p}Al_{3+p}O_pN_{9-p}$, $LaSi_{4-p}Al_{3+p}O_pN_{9-p}$, $LiSi_{4-p}Al_{3+p}O_pN_{9-p}$, $(Ba,Mg)Si_{4-p}Al_{3+p}O_pN_{9-p}$, $(Ba,Ca)Si_{4-p}Al_{3+p}O_pN_{9-p}$, $(Ba,Sr)Si_{4-p}Al_{3+p}O_pN_{9-p}$, $(Ba,La)Si_{4-p}Al_{3+p}O_pN_{9-p}$, or $(Ba,Li)Si_{4-p}Al_{3+p}O_pN_{9-p}$ (where $0 \leq p < 4$).

From the crystal structure data, it was confirmed that the crystal was a new substance having not been reported so far. A powder X-ray diffraction pattern was calculated from the crystal structure data. The result is shown in FIG. 2.

FIG. 2 is a diagram showing a powder X-ray diffraction pattern using Cu Kα-line calculated from the crystal structure of the $BaSi_4Al_3N_9:Eu^{2+}$ system crystal.

Hereafter, it is possible to determine the formation of the $BaSi_4Al_3N_9$ system crystal as shown in FIG. 1 by performing a powder X-ray diffraction measurement of the synthesized compound and comparing the measured powder X-ray diffraction pattern with that of FIG. 2 to find they are the same. Further, since the powder X-ray pattern can be calculated from values of the lattice constants obtained from the powder X-ray diffraction measurement and the crystal structure data of Table 1 with respect to what retains the same crystal structure as the $BaSi_4Al_3N_9$ system crystal and has the varied lattice constants, the formation of the $BaSi_4Al_3N_9$ system crystal can be judged by comparing the measured pattern with the calculated pattern.

Phosphor Examples and Comparative Example; Examples 1 to 14

According to the design compositions as shown in Tables 2 and 3, raw materials were weighed to be raw material mixture compositions (mass ratios) as shown in Table 4. Although there may be a case where a design composition in Tables 2 and 3 and a corresponding raw material mixture composition in Table 4 show difference in the composition depending on the kind of each raw material to be used, the raw material mixture composition was determined such that the amount of each metal ion matches therebetween in such a case. Weighed raw material powders were mixed for 5 minutes using a pestle and a mortar made of silicon nitride sintered body such that a raw mixture of a mixture of metal compounds was obtained. Then, the raw material mixture in a powder condition was fed into a crucible made of boron nitride sintered body. A bulk density of the powder body was approximately from 20% to 30%.

The crucible containing the raw material mixture was set into an electric furnace of a graphite resistance heating type. In the firing operation, first the firing atmosphere was made vacuum of $1 \times 10^{-1}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised at a rate of 500° C. per hour up to each preset temperature as shown in Table 5, and then the temperature was maintained for two (2) hours.

TABLE 2

Design compositions (atomic ratios) in examples and comparative example

| Example | | M element | A element | | | | | D element | E element | X element | |
|---|---|---|---|---|---|---|---|---|---|---|---|
| | | | Ba | Li | Mg | Sr | La | Si | Al | O | N |
| Comparative example | 1 | | 1 | | | | | 4 | 3 | | 9 |
| Example | 2 | Eu 0.1 | 0.9 | | | | | 4 | 3 | | 9 |
| Example | 3 | Eu 0.1 | | | | | 0.9 | 3 | 4 | | 9 |
| Example | 4 | Eu 0.1 | 0.5 | | 0.4 | | | 4 | 3 | | 9 |
| Example | 5 | Eu 0.1 | 0.5 | | | 0.4 | | 4 | 3 | | 9 |
| Example | 6 | Eu 0.1 | 0.5 | | | | 0.4 | 3.5 | 3.5 | | 9 |
| Example | 7 | Eu 0.05 | 0.95 | | | | | 4 | 3 | | 9 |
| Example | 8 | Eu 0.15 | 0.85 | | | | | 4 | 3 | | 9 |
| Example | 9 | Eu 0.25 | 0.75 | | | | | 4 | 3 | | 9 |
| Example | 10 | Eu 0.5 | 0.5 | | | | | 4 | 3 | | 9 |
| Example | 11 | Eu 0.75 | 0.25 | | | | | 4 | 3 | | 9 |
| Example | 12 | Eu 0.1 | 0.4 | 0.5 | | | | 4 | 3 | 0.5 | 8.5 |
| Example | 13 | Eu 0.1 | 0.9 | | | | | 3 | 4 | 1 | 8 |
| Example | 14 | Eu 0.1 | 0.9 | | | | | 2 | 5 | 2 | 7 |

TABLE 3

Design compositions (parameters) in examples and comparative example

| Example | | M element (d) | A element (e) | | | | | D element (f) | E element (g) | X element (h) | |
|---|---|---|---|---|---|---|---|---|---|---|---|
| | | | Ba | Li | Mg | Sr | La | Si | Al | O(h1) | N(h2) |
| Comparative example | 1 | | 0.058824 | | | | | 0.235294 | 0.176471 | | 0.529412 |
| Example | 2 | Eu 0.005882 | 0.052941 | | | | | 0.235294 | 0.176471 | | 0.529412 |
| Example | 3 | Eu 0.005882 | | | | | 0.052941 | 0.176471 | 0.235294 | | 0.529412 |
| Example | 4 | Eu 0.005882 | 0.029412 | | 0.023529 | | | 0.235294 | 0.176471 | | 0.529412 |
| Example | 5 | Eu 0.005882 | 0.029412 | | | 0.023529 | | 0.235294 | 0.176471 | | 0.529412 |
| Example | 6 | Eu 0.005882 | 0.029412 | | | | 0.023529 | 0.205882 | 0.205882 | | 0.529412 |
| Example | 7 | Eu 0.002941 | 0.055882 | | | | | 0.235294 | 0.176471 | | 0.529412 |
| Example | 8 | Eu 0.008824 | 0.05 | | | | | 0.235294 | 0.176471 | | 0.529412 |
| Example | 9 | Eu 0.014706 | 0.044118 | | | | | 0.235294 | 0.176471 | | 0.529412 |
| Example | 10 | Eu 0.029412 | 0.029412 | | | | | 0.235294 | 0.176471 | | 0.529412 |
| Example | 11 | Eu 0.044118 | 0.014706 | | | | | 0.235294 | 0.176471 | | 0.529412 |
| Example | 12 | Eu 0.005882 | 0.023529 | 0.029412 | | | | 0.235294 | 0.176471 | 0.029412 | 0.5 |
| Example | 13 | Eu 0.005882 | 0.052941 | | | | | 0.176471 | 0.235294 | 0.058824 | 0.470588 |
| Example | 14 | Eu 0.005882 | 0.052941 | | | | 0.052941 | 0.117647 | 0.294118 | 0.117647 | 0.411765 |

TABLE 4

Raw material mixture compositions (mass ratios) in examples and comparative example

| Example | | Si3N4 | AlN | Al2O3 | Li3N | Mg3N2 | Sr3N2 | Ba3N2 | LaN | EuN |
|---|---|---|---|---|---|---|---|---|---|---|
| Comparative example | 1 | 40.96 | 26.93 | | | | | 32.11 | | |
| Example | 2 | 40.79 | 26.82 | | | | | 28.78 | | 3.62 |
| Example | 3 | 30.60 | 35.76 | | | | | | 30.02 | 3.62 |
| Example | 4 | 45.24 | 29.75 | | 3.26 | | 17.74 | | | 4.02 |
| Example | 5 | 42.63 | 28.03 | | | | 8.84 | 16.71 | | 3.78 |
| Example | 6 | 35.72 | 31.31 | | | | | 16.00 | 13.35 | 3.62 |
| Example | 7 | 40.87 | 26.87 | | | | | 30.44 | | 1.81 |
| Example | 8 | 40.70 | 26.76 | | | | | 27.12 | | 5.42 |
| Example | 9 | 40.53 | 26.65 | | | | | 23.83 | | 8.99 |
| Example | 10 | 40.11 | 26.37 | | | | | 15.72 | | 17.80 |
| Example | 11 | 39.70 | 26.10 | | | | | 7.78 | | 26.42 |
| Example | 12 | 47.42 | 27.72 | 4.31 | 1.47 | | | 14.87 | | 4.21 |
| Example | 13 | 30.53 | 29.74 | 7.40 | | | | 28.72 | | 3.61 |
| Example | 14 | 20.31 | 32.65 | 14.77 | | | | 28.67 | | 3.61 |

TABLE 5

Firing conditions in examples and comparative example

| Example | | Temperature (° C.) | Ambient pressure (Mpa) | Time (hour) |
|---|---|---|---|---|
| Comparative example | 1 | 1800 | 1 | 2 |
| Example | 2 | 1800 | 1 | 2 |
| Example | 3 | 1800 | 1 | 2 |
| Example | 4 | 1800 | 1 | 2 |
| Example | 5 | 1800 | 1 | 2 |
| Example | 6 | 1800 | 1 | 2 |
| Example | 7 | 1800 | 1 | 2 |
| Example | 8 | 1800 | 1 | 2 |
| Example | 9 | 1800 | 1 | 2 |
| Example | 10 | 1800 | 1 | 2 |
| Example | 11 | 1800 | 1 | 2 |
| Example | 12 | 1800 | 1 | 2 |
| Example | 13 | 1800 | 1 | 2 |
| Example | 14 | 1800 | 1 | 2 |

Next, each synthesized compound was ground using an agate mortar and the powder X-ray diffraction measurement using Cu Kα-line was carried out. Main formation phases are shown in Table 6. Further, from the EDS measurement, it was confirmed that synthesized compounds of Examples 2 to 11 included an rare earth element, an alkali earth metal, Si, Al, and N; and that synthesized compounds of Examples 12 to 14 included an rare earth element, an alkali earth metal, Si, Al, O, and N. Further, with respect to the synthesized compound of Example 12, Li was analyzed using the mass spectrometer. Specifically, the synthesized compound was irradiated with laser light of the wavelength of 213 nm with a beam diameter of 30 μm emitted by the Nd:YAG laser made by New Wave Research, Inc. and the Li element sublimated from the synthesized compound was analyzed by the ICP mass spectrometer.

An X-ray diffraction pattern of any one of examples matched satisfactorily the X-ray diffraction pattern of the $BaSi_4Al_3N_9$:$Eu^{2+}$ crystal obtained by the structure analysis as shown in FIG. 2 and it was confirmed that the crystal having the same crystal structure as the $BaSi_4Al_3N_9$ crystal was a main component.

TABLE 6

Main formation phases in examples and comparative example

| Example | | Main formation phases Main phase |
|---|---|---|
| Comparative example | 1 | Crystal structure identical to that of Table 1 |
| Example | 2 | Crystal structure identical to that of Table 1 |
| Example | 3 | Crystal structure identical to that of Table 1 |
| Example | 4 | Crystal structure identical to that of Table 1 |
| Example | 5 | Crystal structure identical to that of Table 1 |
| Example | 6 | Crystal structure identical to that of Table 1 |
| Example | 7 | Crystal structure identical to that of Table 1 |
| Example | 8 | Crystal structure identical to that of Table 1 |
| Example | 9 | Crystal structure identical to that of Table 1 |
| Example | 10 | Crystal structure identical to that of Table 1 |
| Example | 11 | Crystal structure identical to that of Table 1 |
| Example | 12 | Crystal structure identical to that of Table 1 |
| Example | 13 | Crystal structure identical to that of Table 1 |
| Example | 14 | Crystal structure identical to that of Table 1 |

As shown in Table 6, it was confirmed that the synthesized compounds of the examples according to the present invention had 20 mass % or more of a phase having the identical crystal structure to that of the crystal represented by $BaSi_4Al_3N_9$ as the main formation phase. In Example 4, the synthesized compound was confirmed to include Eu, Ba, Mg, Si, Al, and N from the measurement by means of EDS. In addition, the ratios of Eu:Ba:Mg:Si:Al were confirmed to be 0.1:0.5:0.4:4:3. Here, the difference between the mixed raw material composition and the chemical composition of the synthesized compound suggests that a slight amount of impurity second phase was mixed in the synthesized compound.

As mentioned above, it was confirmed that the synthesized compounds of examples according to the present invention were inorganic compounds comprising the $BaSi_4Al_3N_9$ system crystal into which the activating element M such as Eu was solid-solved.

After firing, the thus-obtained synthesized compound (sintered body) was crushed coarsely and further ground by hand using a crucible and mortar made of silicon nitride sintered body, and then allowed to pass a 30 μm-mesh sieve. When the particle size distribution was measured, the mean particle diameter was 3 to 8 μm.

Figure 3:
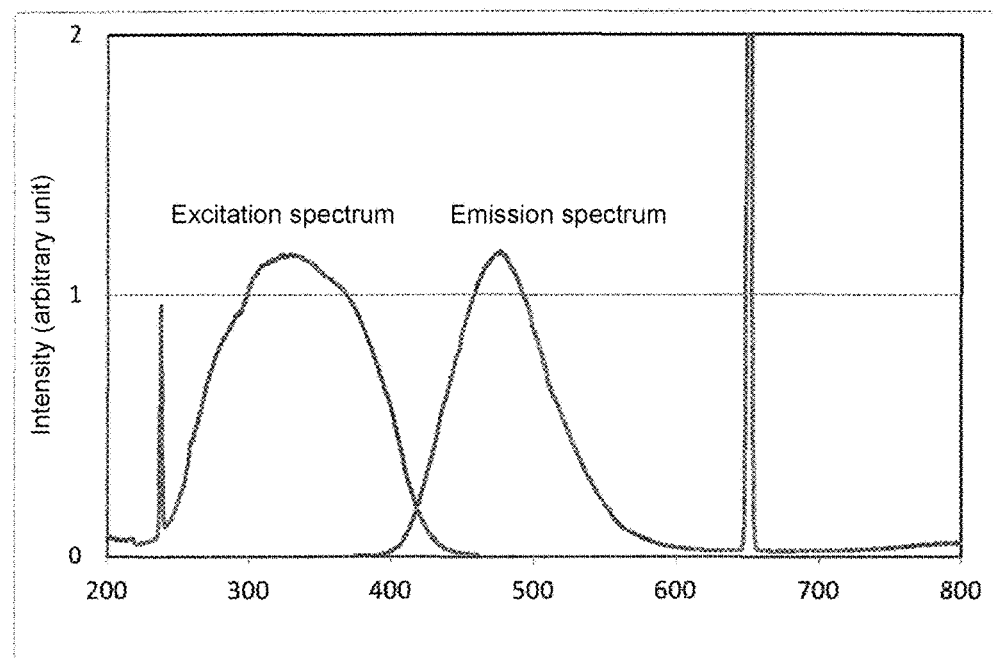
FIG. 3 shows a diagram showing an excitation spectrum and an emission spectrum of a synthesized compound in Example 4.

As a result of irradiating light of wavelength of 365 nm emitted by the lamp onto these powder samples, it was confirmed that these powder samples emitted light of blue-to-green color. An emission spectrum and an excitation spectrum of the powder were measured using a spectrophotofluorometer. The result is shown in FIG. 3. Peak wavelengths of the excitation spectra and peak wavelengths of the emission spectra are shown in Table 7.

FIG. 3 shows a diagram showing an excitation spectrum and an emission spectrum of the synthesized compound in Example 4.

TABLE 7

Excitation emission characteristics in examples and comparative example

| Example | | Excitation peak wavelength (nm) | Emission peak wavelength (nm) | Emission intensity (arbitrary unit) |
|---|---|---|---|---|
| Comparative example | 1 | | | Not emitted |
| Example | 2 | 296 | 471 | 0.29 |
| Example | 3 | 287 | 468 | 0.29 |
| Example | 4 | 324 | 477 | 1.17 |
| Example | 5 | 291 | 465 | 0.29 |
| Example | 6 | 296 | 460 | 0.24 |
| Example | 7 | 296 | 466 | 0.28 |
| Example | 8 | 297 | 466 | 0.24 |
| Example | 9 | 301 | 466 | 0.31 |
| Example | 10 | 307 | 475 | 0.44 |
| Example | 11 | 331 | 477 | 0.33 |
| Example | 12 | 368 | 473 | 1.86 |
| Example | 13 | 299 | 480 | 0.23 |
| Example | 14 | 368 | 525 | 0.35 |

According to FIG. 3, it was found that the synthesized compound of Example 4 could be excited at 324 nm most efficiently, that the emission spectrum upon excitation of 324 nm had a peak at 477 nm and that the synthesized compound of Example 4 exhibited blue color emission. It was also confirmed that an emission color of the phosphor compound of Example 4 was within the following range: 0≤x≤0.4 and 0

According to Table 7, it was confirmed that the synthesized compounds of the present invention could be excited by an ultraviolet ray of 250 nm to 380 nm and violet or blue light of 380 nm to 450 nm and were phosphors to emit blue-to-green light.

As mentioned above, it was found that the synthesized compounds of examples according to the present invention were inorganic compounds comprising the $BaSi_4Al_3N_9$ system crystal into which the activating element M such as Eu was solid-solved and that the inorganic compounds were phosphors. According to Tables 3 and 7, it should be understood that a phosphor exhibiting blue-to-green color emission can be obtained by controlling the composition to a specific composition.

Figure 4:
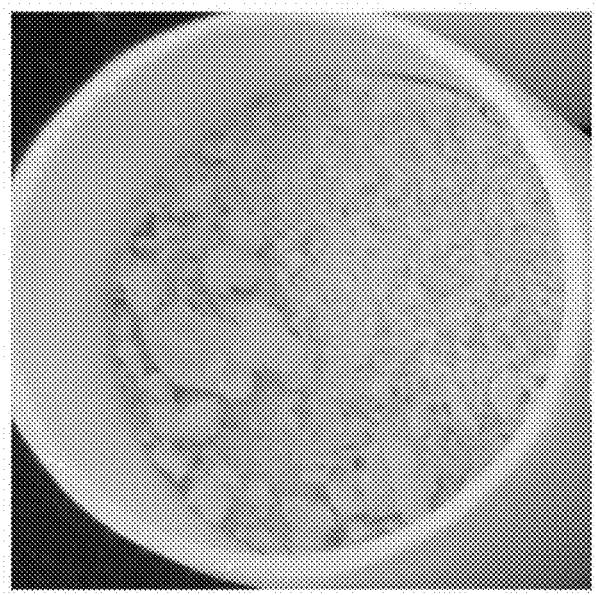
FIG. 4 shows a diagram showing an object color of a synthesized compound in Example 4.

FIG. 4 shows a diagram showing an object color of the synthesized compound in Example 4.

According to Table 4, it was confirmed that the synthesized compounds obtained in Example 4 had a white color as an object color and was excellent in the coloration. Here, the diagram is shown in black and white due to the regulation of the application documents, but the original picture is in color and the color figure is readily submitted upon request. Although not shown in the figure, synthesized compounds of other Examples also exhibited a similar object color. The inorganic compounds of the synthesized compounds according to the present invention exhibited the object color of white by irradiation of the sunlight or an illumination such as a fluorescent lamp such that it was found that they could be utilized for the pigment or the fluorescent pigment.

Examples of Light-Emitting Device and Image Display Device; Examples 15 to 18

Next, a light-emitting device utilizing the phosphor of the present invention will be described.

Example 15

Figure 5:
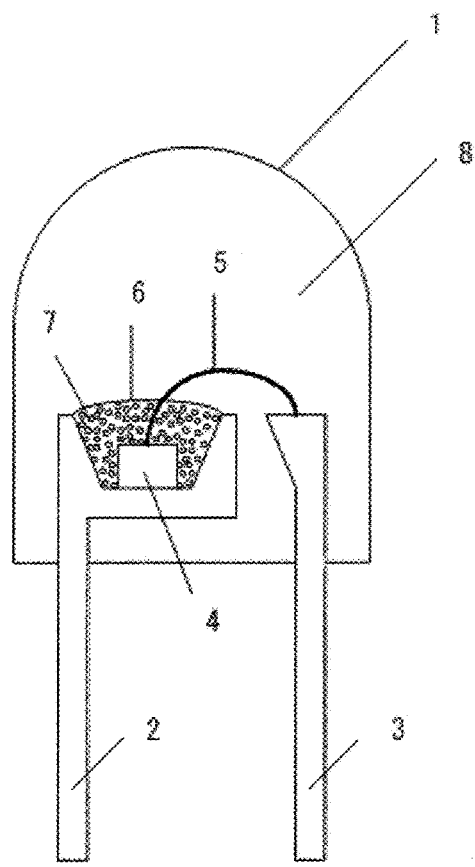
FIG. 5 shows a schematic diagram illustrating an illuminating device (bullet-type of LED illuminating device) according to the present invention.

FIG. 5 shows a schematic diagram illustrating an illuminating device (bullet-type of LED illuminating device) according to the present invention.

A so-called bullet-type white light-emitting diode lamp (1) shown in FIG. 5 was produced. There are two lead wires (2, 3), one of which (2) has a recess, in which an ultraviolet light-emitting diode element (4) having an emission peak of 365 nm is placed. The lower electrode of the ultraviolet light-emitting diode element (4) and the bottom surface of the recess are electrically connected with conductive paste, and the upper electrode and the other lead wire (3) are electrically connected through a bonding wire (5) of a gold thin wire. The phosphor (7) is dispersed in resin and mounted in the vicinity of the ultraviolet light-emitting diode element (4). The first resin (6) in which this phosphor is dispersed is transparent, and covers the entire ultraviolet light-emitting diode element (4). The tip-top portion of the lead wire including the recess, the ultraviolet light-emitting diode element, and the first resin in which the phosphor is dispersed are sealed with transparent second resin (8). A second resin (8) which is transparent is formed approximately in a cylindrical shape as a whole and the top portion is rounded in a lens shape such that the lamp is generally referred to as a bullet-type.

In the present embodiment, a phosphor powder prepared by mixing the blue phosphor prepared for Example 4, the green phosphor prepared for Example 14, a red phosphor of $CaAlSiN_3$:Eu was mixed into epoxy resin at the concentration of 35 wt %, and this resultant mixture was dropped in an appropriate amount with a dispenser such that the first resin (6) was formed to have blended phosphor (7) dispersed therein. The light emitted by the thus-obtained light-emitting device had an emission color of white and characterized by x=0.33 and y=0.33 in the color coordinates.

Example 16

Figure 6:
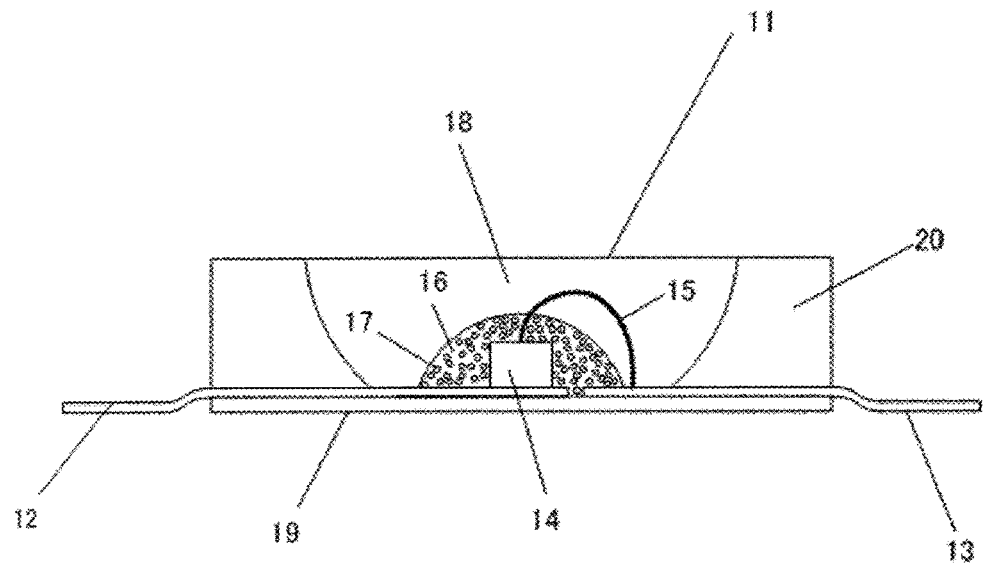
FIG. 6 shows a schematic diagram illustrating an illuminating device (board-mounting-type LED illuminating device) according to the present invention.

FIG. 6 is a schematic diagram showing an illuminating device (board-mounting-type LED illuminating device) according to the present invention.

A chip-type white light-emitting diode lamp (11) for board-mounting as shown in FIG. 6 was produced. Two lead wires (12, 13) are fixed to a white alumina ceramic board (19) having high reflectance of visible light and one end of each of the wires is located at approximately the center portion of the board and the other end of each of the wires extends outside to serve as an electrode to be soldered when the lamp is mounted on the electric board. One of the lead wires (12) has the one end on which an violet light-emitting diode element (14) having an emission peak wavelength of 405 nm is placed and fixed thereto such that the element is located at the center of the board. The lower electrode of the violet light-emitting diode element (14) and the lead wire below are electrically connected with conductive paste, and the upper electrode and the other lead wire (13) are electrically connected with a bonding wire (15) of a gold thin wire.

A material prepared by mixing the first resin (16) and a phosphor (17) prepared by blending the blue phosphor prepared for Example 4 and a yellow phosphor represented by α-sialon:Eu is mounted in the vicinity of the light-emitting diode element. The first resin in which this phosphor is dispersed is transparent, and covers the entire violet light-emitting diode element (14). Also, a wall surface member (20) having a hole opened at the center portion is fixed to the ceramic board. The wall surface member (20) has the center portion formed as the hole in which the violet light-emitting diode element (14) and the resin (16) having the phosphor (17) dispersed therein are contained and the portion of the hole facing the center is made to be a slope. This slope is a reflective surface for taking out light forward, and the shape of the curved surface of the slope is determined in consideration of the direction of light reflection. Further, at least the surface which constitutes the reflective surface forms a surface having high visible light reflectance with white color or metallic luster. In the present example, the wall surface member (20) is configured with white silicone resin. The hole at the center portion of the wall surface member is formed with a recess as the final shape of the chip-type light emitting diode lamp, and is filled up with second transparent resin (18) to seal all of the violet light-emitting diode element (14) and the first resin (16) in which the phosphor (17) is dispersed. In the present example, the same epoxy resin was used for both the first resin (16) and second resin (18). The attained chromaticity and the like are approximately identical to those in Example 15.

Next, an example of design of an image display device using the phosphor of the present invention will be described.

Example 17

Figure 7:
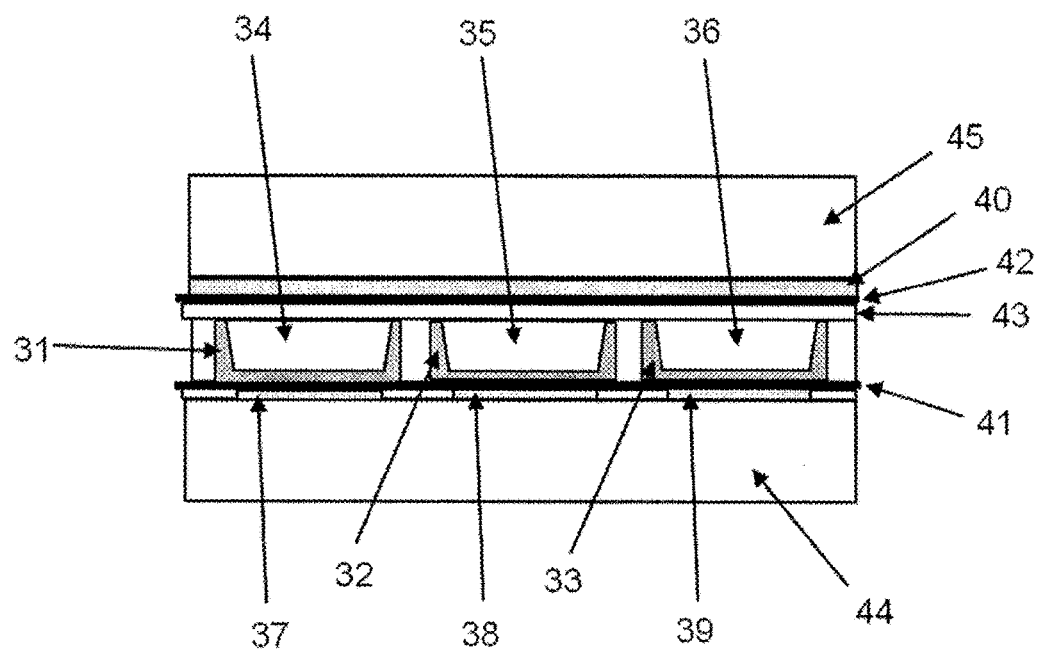
FIG. 7 shows a schematic diagram illustrating an image display device (plasma display panel) according to the present invention.

FIG. 7 shows a schematic diagram illustrating an image display device (plasma display panel) according to the present invention.

A red phosphor ($CaAlSiN_3$:Eu) (31), a green phosphor (32) prepared for Example 14, and the blue phosphor (33) prepared for Example 4 are applied to inner surfaces of the respective cells (34, 35, 36), which are arranged via electrodes (37, 38, 39) and a dielectric layer (41) over a glass substrate (44). If electric power is supplied to the electrodes (37, 38, 39, 40), a vacuum ultraviolet ray is generated by Xe discharge in each of the cells, thereby exciting the respective phosphors so as to emit visible light of a red color, a green color, or a blue color such that the emitted light may be observed from the outside through a protective layer (43), a dielectric layer (42), and a glass substrate (45) so as to serve as an image display device.

Example 18

Figure 8:
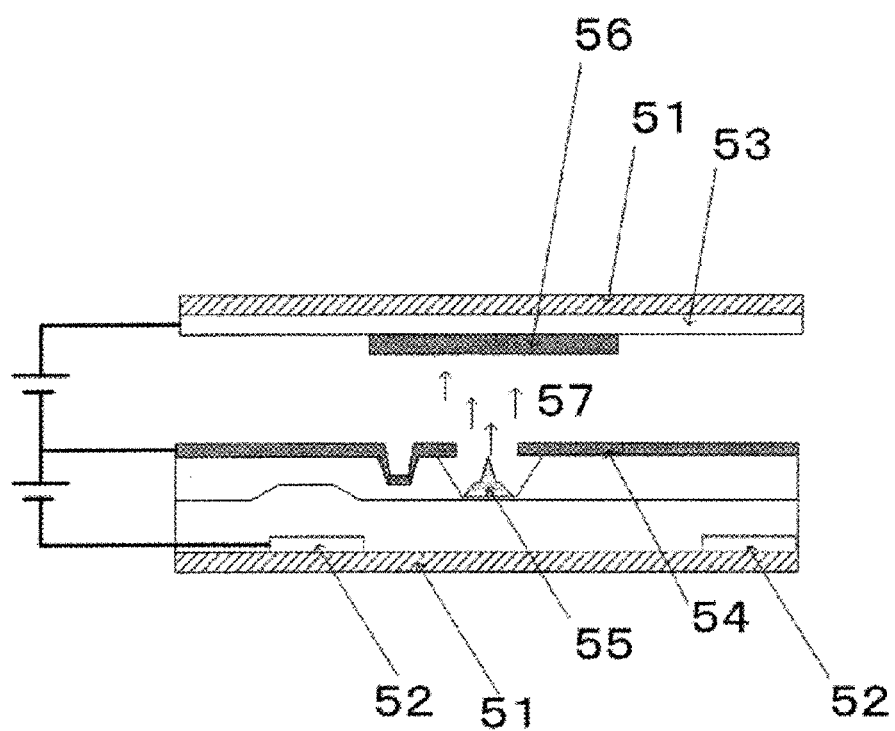
FIG. 8 shows a schematic diagram illustrating an image display device (field emission display panel) according to the present invention.

FIG. 8 shows a schematic diagram illustrating an image display device (field emission display panel) according to the present invention.

The blue phosphor (56) prepared for Example 4 of the present invention is applied to an interior surface of an anode (53). By applying a voltage between a cathode (52) and a gate (54), electrons (57) are emitted from an emitter (55). The electrons are accelerated by the voltage between the anode (53) and cathode, and impinge on the blue phosphor (56) to excite the phosphor to emit light. The entire device is protected by a glass (51). Although the drawing shows a single light emission cell comprising one emitter and one phosphor, a display is actually configured to emit light of a variety of color by arranging many cells for a red color and a green color in addition to for a blue color. Although the phosphors to be used for cells for a green color and a red color are not particularly specified, a phosphor which exhibits high brightness under a low speed electron beam is preferable.

INDUSTRIAL APPLICABILITY

The phosphor of the present invention has different emission characteristics (emission color and excitation characteristics, emission spectrum) from those of the conventional phosphor, exhibits high emission intensity in the case where it is combined with a LED of less than 450 nm, is chemically and thermally stable, and further has little degradation in the intensity of the phosphor when it is exposed to the excitation source for a long period of time such that it is a phosphor to be used suitably for the VFD, the FED, the PDP, the CRT, the white LED and LCD. It is expected that the phosphor of the present invention will be utilized in material design in various kinds of display devices so as to contribute to the development of the industry.

EXPLANATION OF NUMERALS 1 bullet-type light-emitting diode lamp.
2, 3 lead wire.
4 light-emitting diode element.
5 bonding wire.
6, 8 resin.
7 phosphor.
11 chip-type white light-emitting diode lamp for
11 board-mounting.
12, 13 lead wire.
14 light-emitting diode element.
15 bonding wire.
16, 18 resin.
17 phosphor.
19 alumina ceramic board.
20 wall surface member.
31 red phosphor.
32 green phosphor.
33 blue phosphor.
34, 35, 36 ultraviolet ray emission cell.
37, 38, 39, 40 electrode.
41, 42 dielectric layer.
43 protective layer.
44, 45 glass substrate.
51 glass.
52 cathode.
53 anode.
54 gate.
55 emitter.
56 phosphor.
57 electrons.

What is claimed is:

1. A phosphor comprising: an inorganic compound comprising: a crystal represented by $BaSi_4Al_3N_9$, an inorganic crystal having a same crystal structure as the crystal represented by $BaSi_4Al_3N_9$, or a solid solution crystal thereof, which comprises at least an A element, a D element, an E element, and an X element (wherein A is one or more kinds of elements selected from a group consisting of Li, Mg, Ca, Sr, Ba, and La; D is one or more kinds of elements selected from a group consisting of Si, Ge, Sn, Ti, Zr, and Hf; E is one or more kinds of elements selected from a group consisting of B, Al, Ga, In, Sc, and Y; X is one or more kinds of elements selected from a group consisting of O, N, and F), into which an M element is solid-solved (wherein M is one or more kinds of elements selected from a group consisting of Mn, Ce, Pr, Nd, Sm, Eu, Tb, Dy, and Yb)
wherein the inorganic crystal having the same crystal structure as the crystal represented by $BaSi_4Al_3N_9$ comprises a crystal represented by $A(D, E)_7X_9$.

2. The phosphor according to claim 1, wherein: the D element includes Si; the E element includes Al; and the X element includes N and, if necessary, the X element further includes O.

3. The phosphor according to claim 1, wherein the inorganic crystal having the same crystal structure as the crystal represented by $BaSi_4Al_3N_9$ comprises $BaSi_4Al_3N_9$, $MgSi_4Al_3N_9$, $CaSi_4Al_3N_9$, $SrSi_4Al_3N_9$, $LaSi_4Al_3N_9$, $LiSi_4Al_3N_9$, $(Ba,Mg)Si_4Al_3N_9$, $(Ba,Ca)Si_4Al_3N_9$, $(Ba,Sr)Si_4Al_3N_9$, $(Ba,La)Si_4Al_3N_9$, or $(Ba,Li)Si_4Al_3N_9$.

4. The phosphor according to claim 1, wherein the inorganic crystal having the same crystal structure as the crystal represented by $BaSi_4Al_3N_9$ is represented by a composition formula of: $BaSi_{4-p}Al_{3+p}O_pN_{9-p}$, $MgSi_{4-p}Al_{3+p}O_pN_{9-p}$, $CaSi_{4-p}Al_{3+p}O_pN_{9-p}$, $SrSi_{4-p}Al_{3+p}O_pN_{9-p}$, $LaSi_{4-p}Al_{3+p}O_pN_{9-p}$, $LiSi_{4-p}Al_{3+p}O_pN_{9-p}$, $(Ba,Mg)Si_{4-p}Al_{3+p}O_pN_{9-p}$, $(Ba,Ca)Si_{4-p}Al_{3+p}O_pN_{9-p}$, $(Ba,Sr)Si_{4-p}Al_{3+p}O_pN_{9-p}$, $(Ba,La)Si_{4-p}Al_{3+p}O_pN_{9-p}$, or $(Ba,Li)Si_{4-p}Al_{3+p}O_pN_{9-p}$ (here $0 \leq p < 4$).

5. The phosphor according to claim 1, wherein the M element comprises Eu.

6. The phosphor according to claim 1, wherein the inorganic crystal having the same crystal structure as the crystal represented by $BaSi_4Al_3N_9$ comprises a crystal of the monoclinic crystal system.

7. The phosphor according to claim 1, wherein the inorganic crystal having the same crystal structure as the crystal represented by $BaSi_4Al_3N_9$ comprises a crystal of the monoclinic crystal system having a symmetry of space group P2(1)/c and lattice constants a, b, and c having values in following ranges:
a=0.58465±0.05 nm,
b=2.67255±0.05 nm, and
c=0.58386±0.05 nm.

8. The phosphor according to claim 1, wherein the inorganic compound is represented by a composition formula of $M_dA_eD_fE_gX_h$ (wherein, in the formula, d+e+f+g+h=1; M is one or more kinds of elements selected from a group consisting of Mn, Ce, Pr, Nd, Sm, Eu, Tb, Dy, and Yb; A is one or more kinds of elements selected from a group consisting of Li, Mg, Ca, Sr, Ba, and La; D is one or more kinds of elements selected from a group consisting of Si, Ge, Sn, Ti, Zr, and Hf; E is one or more kinds of elements selected from a group consisting of B, Al, Ga, In, Sc, and Y; and X is one or more kinds of elements selected from a group consisting of O, N, and F) and the inorganic compound is expressed by a composition in a range where parameters d, e, f, g, and h satisfy all conditions of:
$0.00001 \leq d \leq 0.05$,
$0.01 \leq e \leq 0.07$,
$0.10 \leq f \leq 0.30$,
$0.10 \leq g \leq 0.30$, and
$0.45 \leq h \leq 0.65$.

9. The phosphor according to claim 8, wherein the parameters d, e, f, g, and h have values in a range satisfying all conditions of:
$d+e=(1/17)\pm 0.05$,
$f+g=(7/17)\pm 0.05$, and
$h=(9/17)\pm 0.05$.

10. The phosphor according to claim 8, wherein the parameters f and g satisfy a condition of: $0 < f/(f+g) \leq 1$.

11. The phosphor according to claim 8, wherein:
the X element includes O and N and
the inorganic compound is represented by a composition formula of $M_dA_eD_fE_gO_{h1}N_{h2}$ (wherein, in the formula, d+e+f+g+h1+h2=1 and h1+h2=h), and
a condition of
$0 < h1/(h1+h2) \leq 6/9$ is satisfied.

12. The phosphor according to claim 8, wherein at least Eu is included as the M element.

13. The phosphor according to claim 8, wherein:
at least Ba is included as the A element;
at least Al is included as the E element; and
at least N is included as the X element.

14. The phosphor according to claim 1, wherein the inorganic compound is represented by a composition formula of $$Eu_qBa_{1-q}Si_{4-p}Al_{3+p}N_{9-p}O_p$$

using parameters p and q
wherein:
  $0 \ge \le p < 4$ and
  $0.0001 \le q < 1$.

15. The phosphor according to claim 1, wherein the phosphor emits fluorescence having a peak in a wavelength range that is at least 450 nm and not exceeding 530 nm upon irradiation by an excitation source.

16. A method of manufacturing a phosphor as recited in claim 1 comprises the step of: firing a raw material mixture, which comprises a mixture of metal compounds and could constitute an inorganic compound as recited in claim 1 by firing, in an inert atmosphere including nitrogen at a temperature range of at least 1200° C. and not exceeding 2200° C.

17. A light-emitting device comprising at least a light-emitting body or an emission source and a phosphor wherein the phosphor comprises at least a phosphor as recited in claim 1.

18. An image display device comprising at least an excitation source and a phosphor wherein the phosphor comprises at least a phosphor as recited in claim 1.

19. A pigment comprising an inorganic compound as recited in claim 1.

20. An ultraviolet absorber comprising an inorganic compound as recited in claim 1.

* * * * *